(12) United States Patent
Jung et al.

(10) Patent No.: US 11,810,937 B2
(45) Date of Patent: Nov. 7, 2023

(54) IMAGE SENSOR AND METHOD FOR FABRICATING THE SAME

(71) Applicant: SAMSUNG ELECTRONICS CO., LTD., Suwon-si (KR)

(72) Inventors: Hae Sung Jung, Suwon-si (KR); Tae-Hun Lee, Suwon-si (KR); Jin Young Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 235 days.

(21) Appl. No.: 17/342,173

(22) Filed: Jun. 8, 2021

(65) Prior Publication Data
US 2022/0068981 A1 Mar. 3, 2022

(30) Foreign Application Priority Data
Sep. 1, 2020 (KR) .......................... 10-2020-0110963

(51) Int. Cl.
*H01L 27/146* (2006.01)

(52) U.S. Cl.
CPC .... *H01L 27/1463* (2013.01); *H01L 27/14623* (2013.01); *H01L 27/14627* (2013.01); *H01L 27/14636* (2013.01); *H01L 27/14685* (2013.01)

(58) Field of Classification Search
CPC .......... H01L 27/1463; H01L 27/14623; H01L 27/14627; H01L 27/14636; H01L 27/14685; H01L 27/14687; H01L 27/14634; H01L 27/14605; H01L 27/1464; H01L 27/14643; H01L 27/14683; H01L 27/1461
See application file for complete search history.

(56) References Cited

U.S. PATENT DOCUMENTS

| | | | |
|---|---|---|---|
| 9,466,629 B2 | 10/2016 | Yoon et al. | |
| 9,806,117 B2 | 10/2017 | Zheng et al. | |
| 9,923,009 B1 | 3/2018 | Hsiung et al. | |
| 10,332,925 B2 | 6/2019 | Oh et al. | |
| 2015/0102448 A1* | 4/2015 | Sato | H01L 27/1463 257/446 |
| 2016/0204144 A1* | 7/2016 | Lee | H01L 27/1464 257/432 |
| 2017/0047363 A1 | 2/2017 | Choi et al. | |
| 2017/0170229 A1 | 6/2017 | Oh et al. | |

(Continued)

*Primary Examiner* — Nelson Garces
(74) *Attorney, Agent, or Firm* — Sughrue Mion, PLLC

(57) ABSTRACT

An image sensor is provided. The image sensor includes a substrate including a first side on which light is incident and a second side opposite the first side; a first separation pattern extending from the second side, the first separation pattern being interposed between unit pixels in the substrate of a light-receiving region and a light-shielding region provided around the light-receiving region; a second separation pattern extending from the first side and overlapping the first separation pattern, the second separation pattern being provided in the substrate of the light-receiving region; and a contact film electrically connected to the first separation pattern, the contact film being provided in the substrate of the light-shielding region. A contact trench which extends from the first side is formed in the light-shielding region of the substrate and exposes the first separation pattern, and the contact film fills at least a part of the contact trench.

20 Claims, 34 Drawing Sheets

(56) References Cited

U.S. PATENT DOCUMENTS

2019/0148427 A1* 5/2019 Lee ................... H01L 27/14607
                                                            257/446
2020/0119067 A1   4/2020 Choi

* cited by examiner

IMAGE SENSOR AND METHOD FOR FABRICATING THE SAME

CROSS-REFERENCE TO RELATED APPLICATION

This application claims priority from Korean Patent Application No. 10-2020-0110963, filed on Sep. 1, 2020 in the Korean Intellectual Property Office, the disclosure of which is incorporated herein by reference in its entirety.

BACKGROUND

1. Technical Field

Devices, methods and systems consistent with example embodiments relate to an image sensor and a method for fabricating the same, and more specifically to an image sensor including a pixel separation pattern and a method for fabricating the same.

2. Related Art

An image sensor is used to convert optical information into an electric signal and may include one or more semiconductor elements. Such an image sensor may include a charge coupled device (CCD) image sensor and a complementary metal-oxide semiconductor (CMOS) image sensor.

The image sensor may be configured in the form of a package, and the package may be configured as a structure that protects the image sensor and allows light to enter a photo receiving surface or a sensing region of the image sensor.

Recently, a backside illumination (BSI) image sensor, in which incident light radiates through a back side of a semiconductor substrate so that pixels formed in the image sensor have improved light reception efficiency and sensitivity, has been studied.

SUMMARY

According to an aspect of an example embodiment, there is provided an image sensor which includes a substrate including a first side on which light is incident and a second side opposite to the first side; a first separation pattern extending from the second side, the first separation pattern being interposed between a plurality of unit pixels in the substrate of a light-receiving region and a light-shielding region provided around the light-receiving region; a second separation pattern extending from the first side and overlapping the first separation pattern, the second separation pattern being provided in the substrate of the light-receiving region; and a contact film electrically connected to the first separation pattern, the contact film being provided in the substrate of the light-shielding region. A contact trench which extends from the first side is formed in the light-shielding region of the substrate and exposes the first separation pattern, and the contact film fills at least a part of the contact trench.

According to an aspect of an example embodiment, there is provided an image sensor which includes a substrate including a first side on which light is incident and a second side opposite to the first side; and a first separation pattern extending from the second side, the first separation pattern being interposed between a plurality of unit pixels in the substrate of a light-receiving region and a light-shielding region provided around the light-receiving region. A first sub-trench which extends from the first side is formed in the substrate of the light-shielding region, a surface insulating film extends along the first sub-trench, a second sub-trench, which is formed in the substrate and extends from the first sub-trench, exposes the first separation pattern and the surface insulating film, and a contact film is provided on the surface insulating film, and extends along the first sub-trench and the second sub-trench to contact the first separation pattern.

According to an aspect of an example embodiment, there is provided an image sensor which includes a first substrate including a first side on which light is incident and a second side opposite to the first side; a first separation pattern extending from the second side, the first separation pattern being interposed between a plurality of unit pixels in the first substrate of a light-receiving region and a light-shielding region provided around the light-receiving region; a second separation pattern extending from the first side and overlapping the first separation pattern, the second separation pattern being provided in the first substrate of the light-receiving region; a plurality of microlenses respectively corresponding to the plurality of unit pixels, the plurality of microlenses being provided on the first side of the first substrate; a first wiring structure including a first inter-wiring insulating film and a first wiring provided in the first inter-wiring insulating film, the first wiring structure being provided on the second side of the first substrate; a contact film extending from the first side and electrically connected to the first separation pattern, the contact film being provided in the first substrate of the light-shielding region; and a pad pattern exposed through the first side on the first substrate of a pad region provided around the light-receiving region.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will more clearly understood from the following detailed description of example embodiments with reference to the attached drawings, in which.

DETAILED DESCRIPTION

Hereinafter, various image sensors according to example embodiments will be explained referring to FIGS. 1 to 16.

Figure 1:
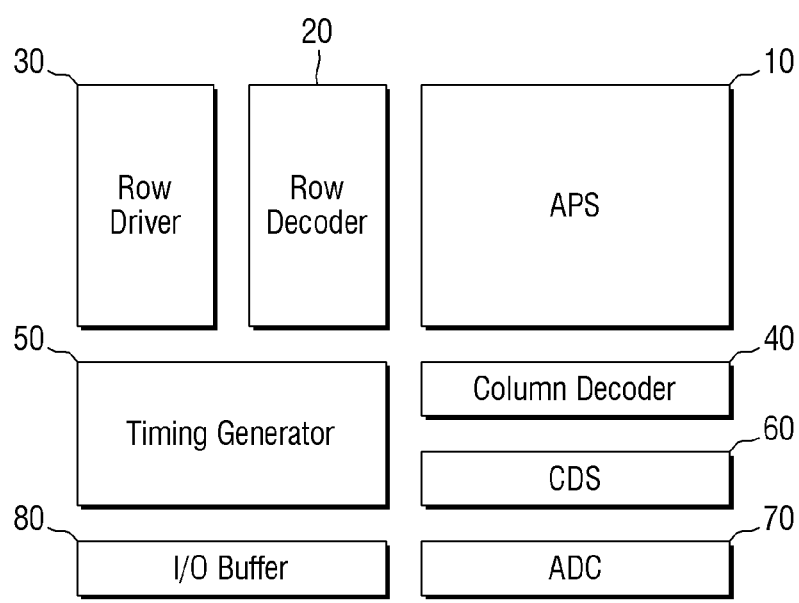
FIG. 1 is an exemplary block diagram for explaining an image sensor according to one or more example embodiments.
Figure 2:
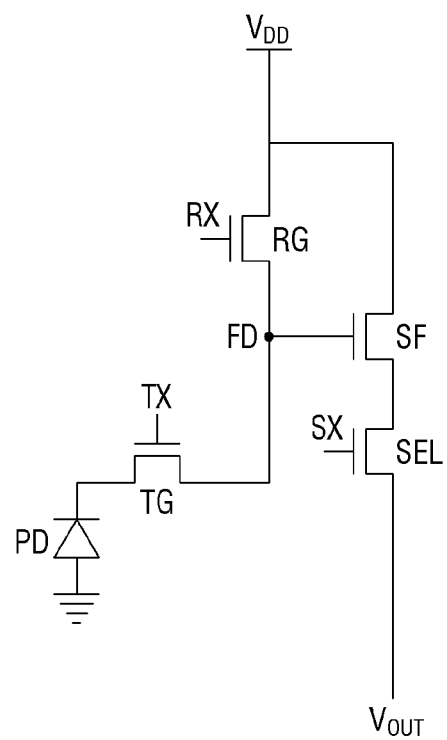
FIG. 2 is an exemplary circuit diagram for explaining a unit pixel of an image sensor according to one or more example embodiments.

FIG. 1 is an exemplary block diagram for explaining an image sensor according to one or more example embodiments. FIG. 2 is an exemplary circuit diagram for explaining a unit pixel of an image sensor according to one or more example embodiments.

Referring to FIG. 1, the image sensor according to one or more example embodiments includes an active pixel sensor array (APS) 10, a row decoder 20, a row driver 30, a column decoder 40, a timing generator 50, a correlated double sampler (CDS) 60, an analog to digital converter (ADS) 70, and an input/output (I/O) buffer 80.

The active pixel sensor array 10 includes a plurality of unit pixels arranged two-dimensionally, and may convert an optical signal into an electric signal. The active pixel sensor array 10 may be driven by a plurality of drive signals, such as pixel selection signals, reset signals and charge transmission signals, received from the row driver 30. Also, the electrical signal converted by the active pixel sensor array 10 may be provided to the correlated double sampler 60.

The row driver 30 may provide the active pixel sensor array 10 with a large number of drive signals for driving a plurality of unit pixels in accordance with the result decoded by the row decoder 20. When the unit pixels are arranged in a form of a matrix, a drive signals may be provided for each row.

The timing generator 50 may provide a timing signal and a control signal to the row decoder 20 and the column decoder 40.

The correlated double sampler (CDS) 60 may receive, hold and sample the electrical signals generated by the active pixel sensor array 10. The correlated double sampler 60 may doubly sample a specific noise level and the signal level due to the electrical signal, and output a difference level corresponding to a difference between the noise level and the signal level.

The analog to digital converter (ADC) 70 may convert an analog signal corresponding to a difference level, which is output from the correlated double sampler 60, into a digital signal and output the digital signal.

The I/O buffer 80 latches the digital signal, and the latched signal may output sequentially the digital signal to an image signal processing unit in accordance with the decoding result from the column decoder 40.

Referring to FIG. 2, each unit pixel may include a photoelectric conversion layer PD, a transmission transistor TG, a floating diffusion region FD, a reset transistor RG, a source follower transistor SF, and a selection transistor SEL.

The photoelectric conversion layer PD may generate a charge in proportion to an amount of light that is incident thereon. The photoelectric conversion layer PD may be coupled with the transmission transistor TG that transmits the generated and accumulated charge to the floating diffusion region FD. Because the floating diffusion region FD is a region which converts the charge into a voltage and has a parasitic capacitance, the charge may be accumulatively stored.

One end of the transmission transistor TG may be connected to the photoelectric conversion layer PD, and the other end of the transmission transistor TG may be connected to the floating diffusion region FD. The transmission transistor TG may be formed of a transistor driven by a predetermined bias (e.g., transmission signal TX). That is, the transmission transistor TG may transmit the charge generated from the photoelectric conversion layer PD to the floating diffusion region FD in accordance with the transmission signal TX.

The source follower transistor SF may amplify a change in electrical potential of the floating diffusion region FD which receives the charge from the photoelectric conversion layer PD, and may output it to an output line $V_{OUT}$. When the source follower transistor SF is turned on, a predetermined electrical potential provided to a drain of the source follower transistor SF, for example, a power supply voltage $V_{DD}$ may be transferred to a drain region of the selection transistor SEL.

The selection transistor SEL may select a unit pixel to be read row by row. The selection transistor SEL may be made up of a transistor driven by a selection line that applies a predetermined bias (e.g., a row selection signal SX).

The reset transistor RG may periodically reset the floating diffusion region FD. The reset transistor RG may be made up of a transistor that is driven by a reset line that applies a predetermined bias (e.g., reset signal RX). When the reset transistor RG is turned on by the reset signal RX, a predetermined electrical potential provided to the drain of the reset transistor RG, for example, the power supply voltage $V_{DD}$, may be transferred to the floating diffusion region FD.

Figure 3A:
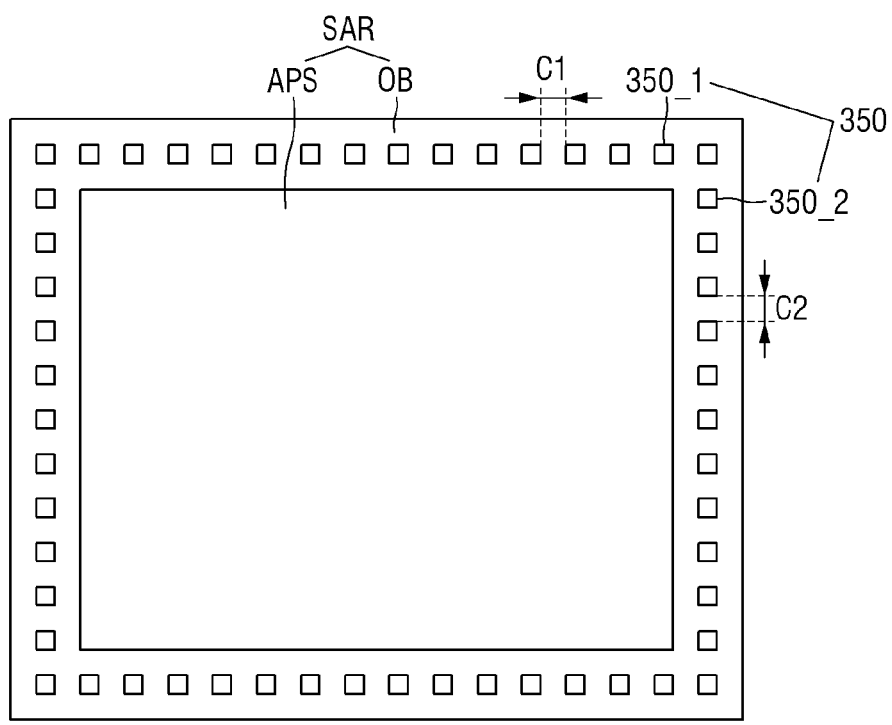
FIGS. 3A, 3B and 3C are schematic layout views for explaining an image sensor according to one or more example embodiments.
Figure 3B:
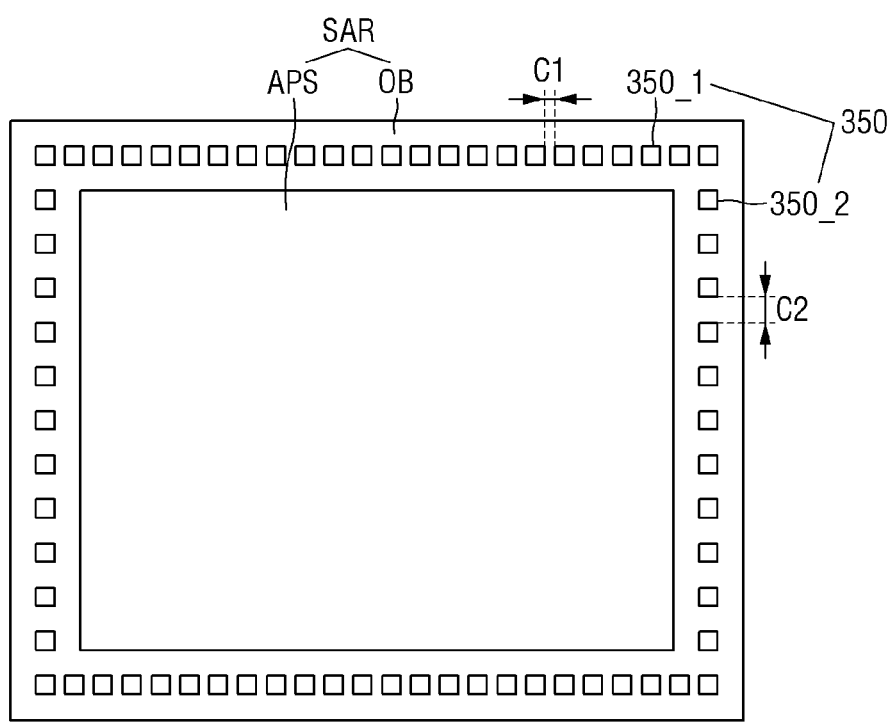
Figure 3C:
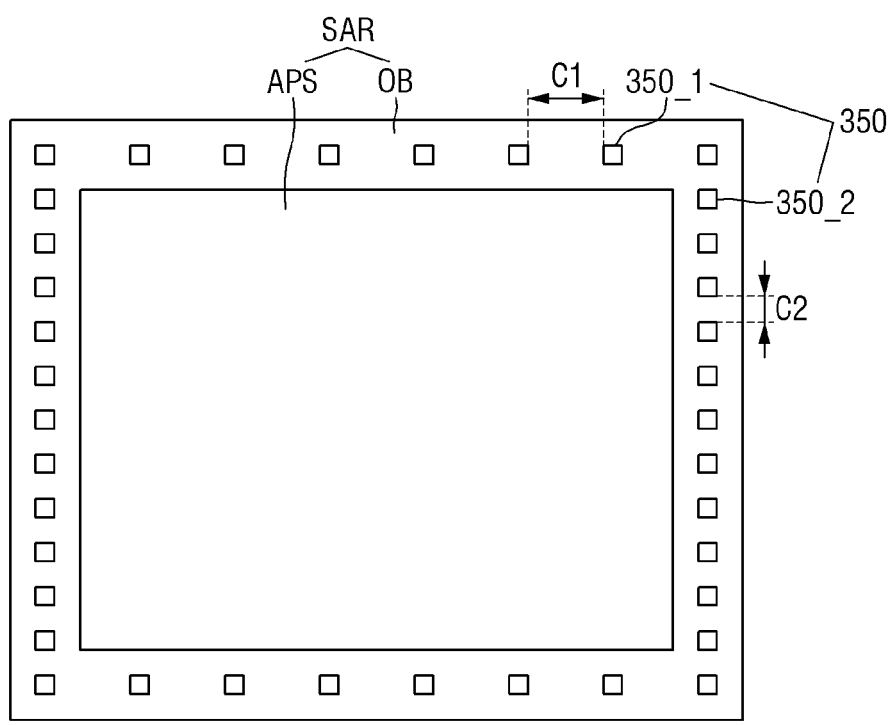
Figure 4:
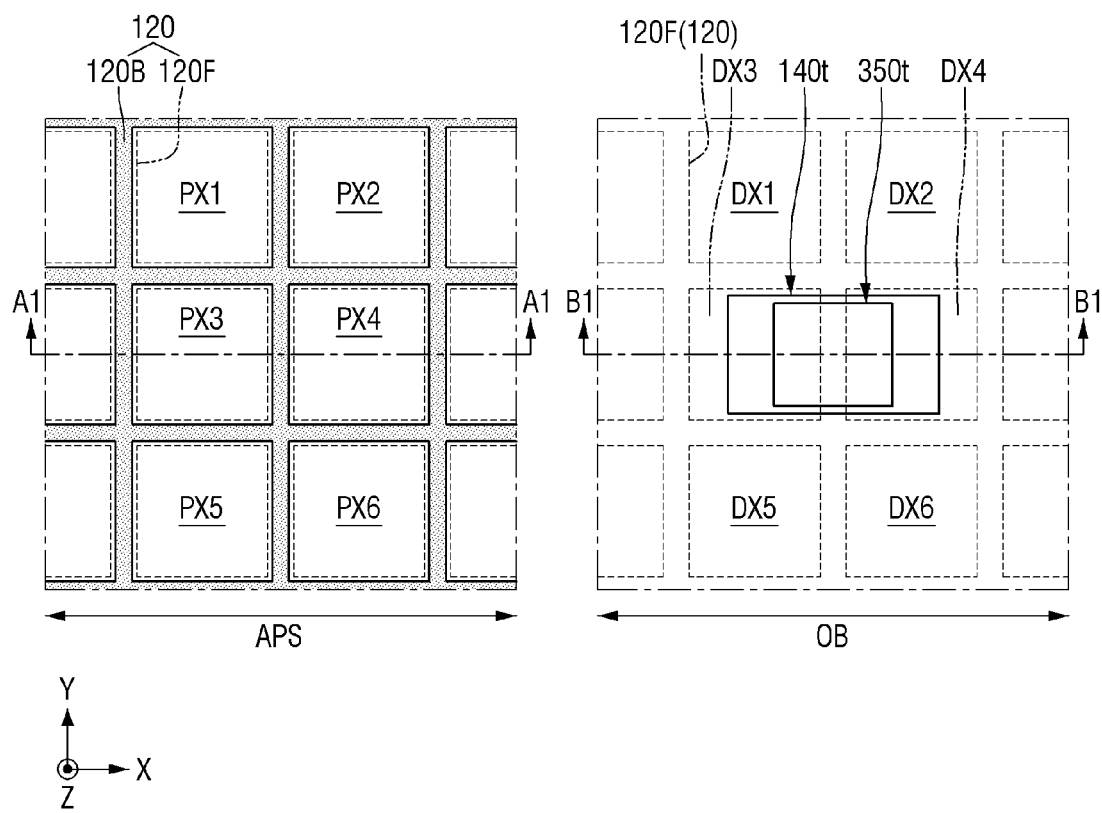
FIG. 4 is a layout view for explaining a light-receiving region and a light-shielding region of FIG. 3A.
Figure 5:
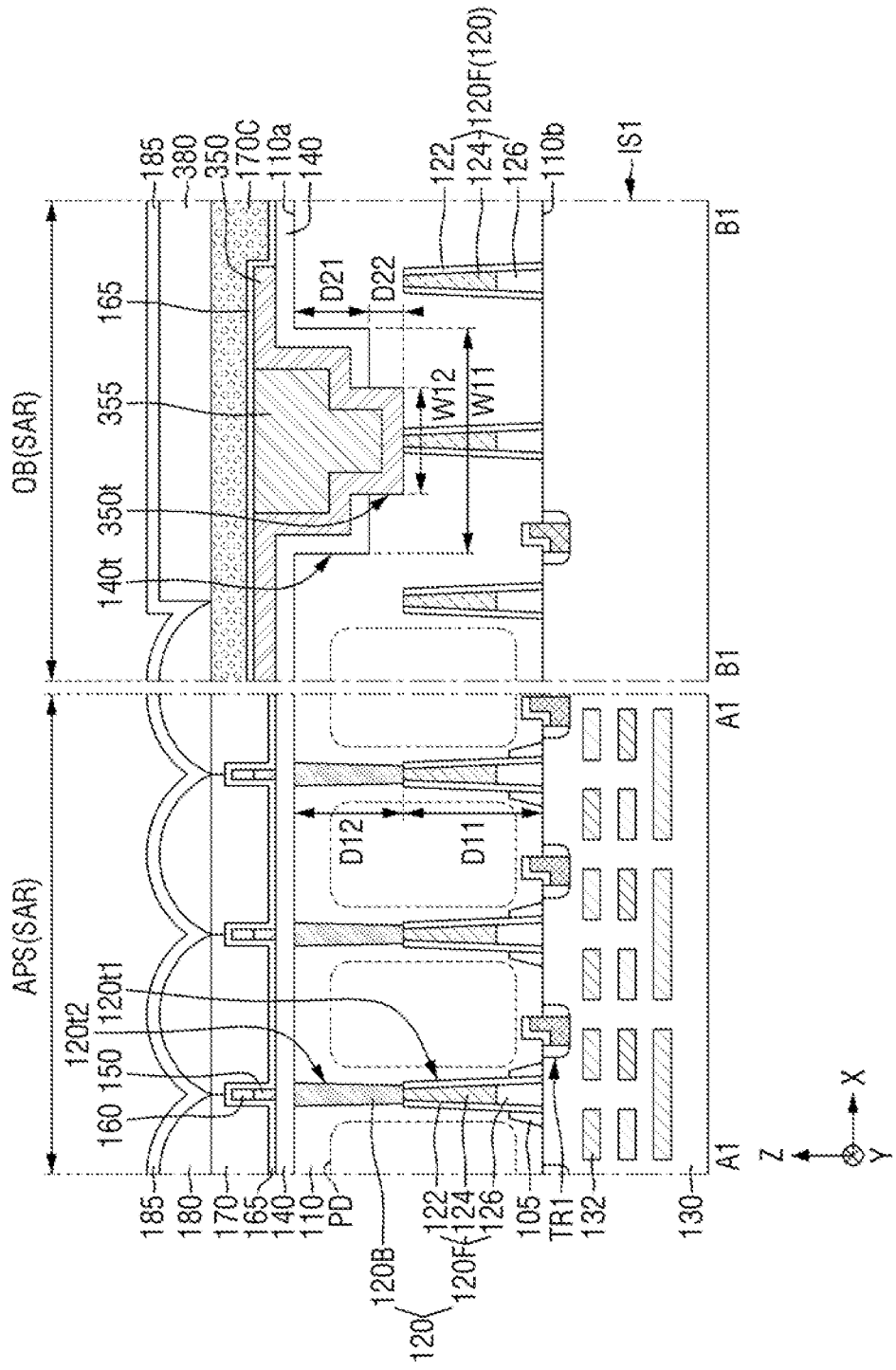
FIGS. 5 to 7 are various cross-sectional views taken along A1-A1 and B1-B1 of FIG. 4.
Figure 6:
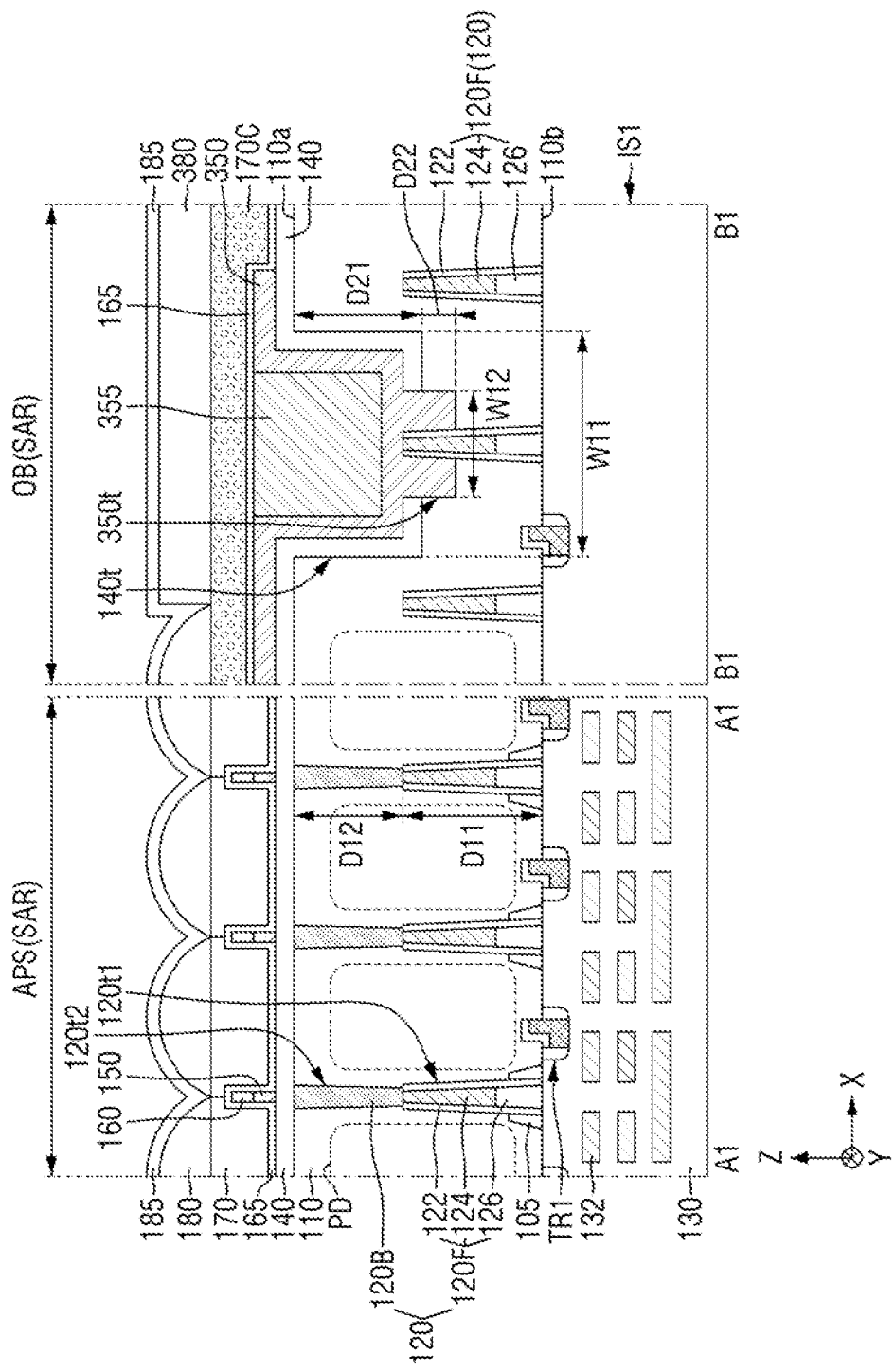
Figure 7:
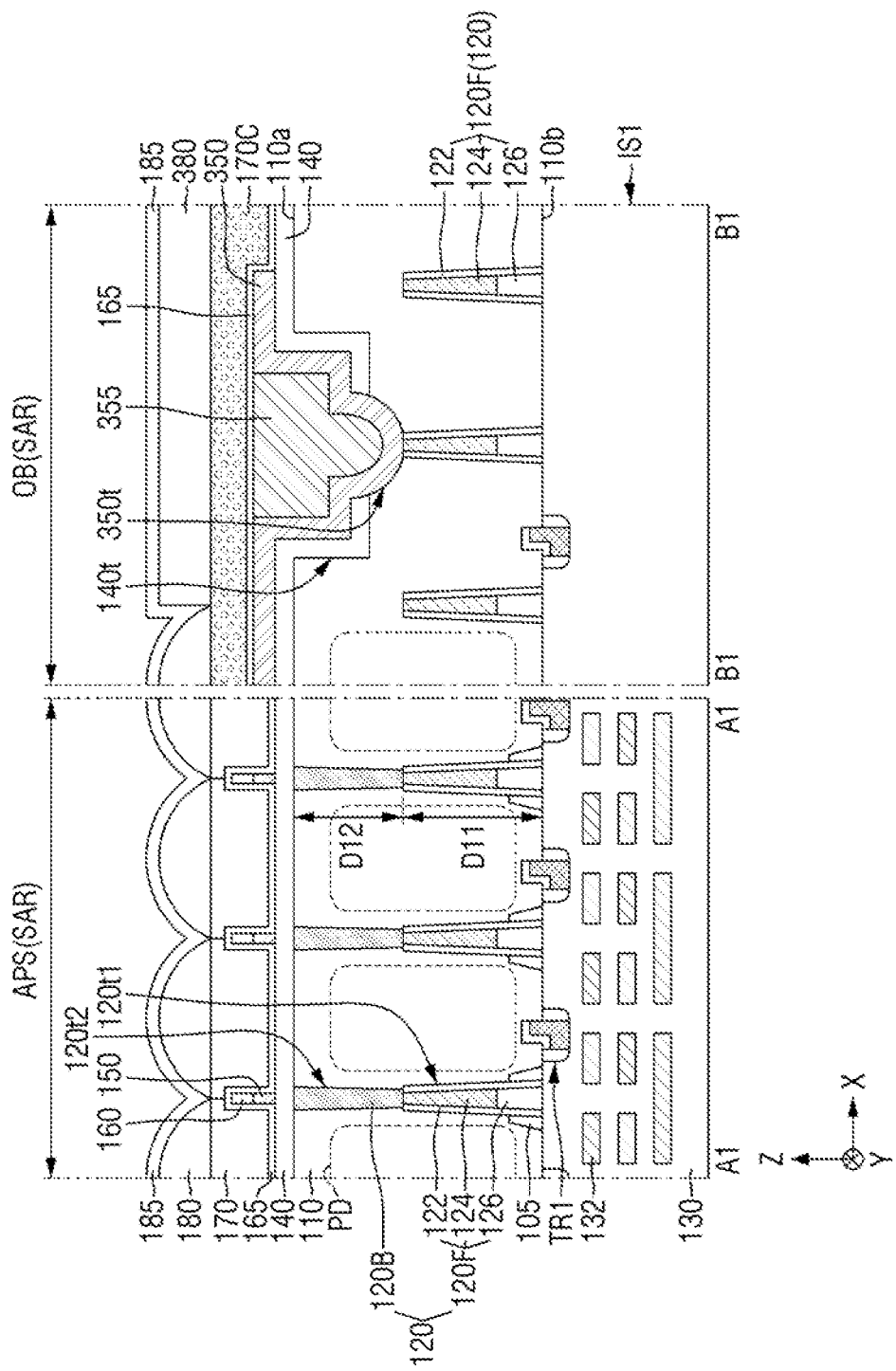

FIG. 3A to 3C is a schematic layout view for explaining an image sensor according to one or more example embodiments. FIG. 4 is a layout view for explaining a light-receiving region and a light-shielding region of FIG. 3A to 3C. FIGS. 5 to 7 are various cross-sectional views taken along A1-A1 and B1-B1 of FIG. 4.

Referring to FIGS. 3A to 3C and 4, the image sensor according to one or more example embodiments may include a sensor array region SAR.

The sensor array region SAR may include a region corresponding to the active pixel sensor array 10 of FIG. 1. For example, a plurality of unit pixels PX1 to PX6 and DX1 to DX6 arranged two-dimensionally (for example, in the form of a matrix) may be formed in the sensor array region SAR.

The sensor array region SAR may include a light-receiving region APS and a light-shielding region OB. The light-shielding region OB may be placed around the light-receiving region APS. Active pixels PX1 to PX6 that receive light and generate an active signal may be arranged in the light-receiving region APS. Black pixels DX1 to DX6 that shield light to generate an optical black signal may be arranged in the light-shielding region OB. Although the light-shielding region OB may be formed, for example, in the form of surrounding the periphery of the light-receiving region APS, example embodiments are not limited thereto.

A length extending in the first direction X of the active pixel sensor array 10 may be longer than a length extending in the second direction Y of the active pixel sensor array 10. Accordingly, a length extending in the first direction X of the light-shielding region OB may be longer than a length extending in the second direction Y of the light-shielding region OB, but it is not limited to.

Referring to FIGS. 3A to 5, the image sensor according to one or more example embodiments may include a first substrate 110, a first insulating pattern 105, a pixel separation pattern 120, a first wiring structure IS1, a surface insulating film 140, a contact film 350, a color filter 170, a light-shielding filter 170C and a microlens 180.

The first substrate 110 may be a semiconductor substrate. For example, the first substrate 110 may be bulk silicon or silicon-on-insulator (SOI). The first substrate 110 may be a silicon substrate or may include other substances, for example, silicon germanium, indium antimonide, lead tellurium compounds, indium arsenic, indium phosphide, gallium arsenide or gallium antimonide. The first substrate 110 may have an epitaxial layer formed on a base substrate.

The first substrate 110 may include a first side 110a and a second side 110b that are opposite to each other. In the example embodiments described below, the first side 110a may be referred to as a back side of the first substrate 110, and the second side 110b may be referred to as a front side of the first substrate 110. In one or more example embodiments, the first side 110a of the first substrate 110 may be a light-receiving surface on which light is incident. That is, the image sensor according to one or more example embodiments may be a back illuminated (BSI) image sensor.

A plurality of unit pixels PX1 to PX6 and DX1 to DX6 may be formed in the first substrate 110. The plurality of unit pixels PX1 to PX6 and DX1 to DX6 may be arranged two-dimensionally (for example, in the form of a matrix), for example, in a plane extending in a first direction X and a second direction Y. The unit pixels PX1 to PX6 and DX1 to DX6 may include active pixels PX1 to PX6 placed in the light-receiving region APS and black pixels DX1 to DX6 placed in the light-shielding region OB.

Each of the active pixels PX1 to PX6 may include a photoelectric conversion layer PD. The photoelectric conversion layer PD may be formed in the first substrate 110 of the light-receiving region APS. The photoelectric conversion layer PD may generate a charge in proportion to an amount of light that is incident from the outside.

The photoelectric conversion layer PD may be formed by doping impurities in the first substrate 110. For example, the photoelectric conversion layer PD may be formed by ion-implanting n-type impurities into the p-type first substrate 110. In one or more example embodiments, the photoelectric conversion layer PD may have a potential slope in the vertical direction Z intersecting the surface of the first substrate 110 (e.g., the first side 110a or the second side 110b). For example, the impurity concentration of the photoelectric conversion layer PD may decrease from the second side 110b toward the first side 110a.

The photoelectric conversion layer PD may include, for example, but is not limited to, at least one of a photo diode, a photo transistor, a photo gate, a pinned photo diode, an organic photo diode, a quantum dot, and a combination thereof.

In one or more example embodiments, the photoelectric conversion layer PD may also be formed in a part of the first substrate 110 of the light-shielding region OB. For example, some of the black pixels DX1 to DX6 include the photoelectric conversion layer PD, and some others of the black pixels DX1 to DX6 may not include the photoelectric conversion layer PD. As an example, the photoelectric conversion layer PD may also be formed in the first substrate 110 of the light-shielding region OB adjacent to the light-receiving region APS.

Each of the unit pixels PX1 to PX6 and DX1 to DX6 may include a first electronic element TR1. In one or more example embodiments, the first electronic element TR1 may be formed on the second side 110b of the first substrate 110. The first electronic element TR1 may include various transistors for processing the electric signals generated from the unit pixels PX1 to PX6 and DX1 to DX6. For example, the first electronic element TR1 may include transistors such as the transmission transistor TG, the reset transistor RG, the source follower transistor SF or the selection transistor SEL explained above in the explanation of FIG. 2.

In one or more example embodiments, the first electronic element TR1 may include a vertical transmission transistor. For example, a part of the first electronic element TR1 including the above-mentioned transmission transistor TG may extend into the first substrate 110. Such a transmission transistor TG may reduce an area of a unit pixel and enable high integration of an image sensor.

The first insulating pattern 105 may be formed in the first substrate 110. The first insulating pattern 105 may be formed, for example, by embedding an insulating substance in a shallow trench formed by patterning the first substrate 110. In one or more example embodiments, the first insulating pattern 105 may extend from the second side 110b of the first substrate 110.

The first insulating pattern 105 may define the active region of each of the unit pixels PX1 to PX6 and DX1 to DX6. For example, the first insulating pattern 105 may separate transistors such as the transmission transistor TG, the reset transistor RG, the source follower transistor SF or the selection transistor SEL explained above in FIG. 2 from each other.

In one or more example embodiments, a width of the first insulating pattern 105 may decrease as distance away from the second side 110b of the first substrate 110 increases. Here, the width means a width in a direction parallel to the surface of the first substrate 110 (for example, the first side 110a or the second side 110b). Although this may be due to an etching process for forming the first insulating pattern 105 that is performed on the second side 110b of the first substrate 110, example embodiments are not limited thereto.

The first insulating pattern 105 may include, for example, but is not limited to, at least one of silicon oxide, silicon nitride, silicon oxynitride, aluminum oxide, tantalum oxide, and combinations thereof.

The pixel separation pattern 120 may be formed in the first substrate 110. The pixel separation pattern 120 may define a plurality of unit pixels PX1 to PX6 and DX1 to DX6 in the first substrate 110. For example, as shown in FIG. 4, the pixel separation pattern 120 may surround each of the unit pixels PX1 to PX6 and DX1 to DX6.

The pixel separation pattern 120 may include a first separation pattern 120F and a second separation pattern 120B. The first separation pattern 120F may extend from the second side 110b of the first substrate 110. The second separation pattern 120B may extend from the first side 110a of the first substrate 110 and may overlap at least a part of the first separation pattern 120F. Here, the overlap means that they overlap in the vertical direction Z.

For example, a first separation trench 120t1 extending from the second side 110b may be formed in the first substrate 110. The first separation pattern 120F may fill the first separation trench 120t1. Also, a second separation trench 120t2 extending from the first side 110a and overlapping at least a part of the first separation trench 120t1 may be formed in the first substrate 110. The second separation pattern 120B may fill the second separation trench 120t2.

The pixel separation pattern 120 of the light-receiving region APS may define a plurality of active pixels PX1 to PX6 in the first substrate 110. For example, as shown in FIG. 4, the first separation pattern 120F of the light-receiving region APS may surround each of the active pixels PX1 to PX6. Also, the second separation pattern 120B of the light-receiving region APS may surround of each of the active pixels PX1 to PX6.

The pixel separation pattern 120 of the light-shielding region OB may define a plurality of black pixels DX1 to DX6 in the first substrate 110. For example, as shown in FIG. 4, the first separation pattern 120F of the light-shielding region OB may surround each of the black pixels DX1 to DX6. That is, the first separation pattern 120F may define a plurality of unit pixels PX1 to PX6 and DX1 to DX6 over the light-receiving region APS and the light-shielding region OB.

In one or more example embodiments, the pixel separation pattern 120 of the light-shielding region OB may not include the second separation pattern 120B. That is, the second separation pattern 120B may not be placed inside the light-shielding region OB. For example, as shown in FIG. 4, the second separation pattern 120B may not surround each of the black pixels DX1 to DX6.

In one or more example embodiments, the width of the first separation pattern 120F may decrease as distance away from the second side 110b of the first substrate 110 increases. Here, the width means a width in a direction parallel to the surface of the first substrate 110 (for example, the first side 110a or the second side 110b). This may be due to, but is not limited to, an etching process for forming the first separation trench 120t1 that is performed on the second side 110b of the first substrate 110.

In one or more example embodiments, the width of the second separation pattern 120B may decrease as distance away from the first side 110a of the first substrate 110 increases. Here, the width means a width in a direction parallel to the surface of the first substrate 110 (for example, the first side 110a or the second side 110b). This may be due to, but is not limited to, an etching process for forming the second separation trench 120t2 that is performed on the first side 110a of the first substrate 110.

The first separation pattern 120F may be formed at a first depth D11 from the second side 110b of the first substrate 110. The second separation pattern 120B may be formed at a second depth D12 from the first side 110a of the first substrate 110. The first depth D11 and the second depth D12 may each be smaller than the thickness of the first substrate 110. That is, the first separation pattern 120F may be spaced apart from the first side 110a of the first substrate 110, and the second separation pattern 120B may be spaced apart from the second side 110b of the first substrate 110.

In one or more example embodiments, the first depth D11 may be greater than the second depth D12. As an example, the first depth D11 may be about 3 μm to about 4 μm, and the second depth D12 may be about 1.5 μm to about 2.5 μm.

In one or more example embodiments, the first separation pattern 120F and the second separation pattern 120B may be in contact with each other. For example, a lower side of the second separation trench 120t2 may expose the upper side of the first separation pattern 120F. The second separation pattern 120B is formed in the second separation trench 120t2 and may be in contact with the upper side of the first separation pattern 120F. Accordingly, the pixel separation pattern 120 of the light-receiving region APS may extend from the first side 110a of the first substrate 110 to the second side 110b of the first substrate 110. That is, the sum of the first depth D11 and the second depth D12 may be the thickness of the first substrate 110. The pixel separation pattern 120 may completely separate the active pixels PX1 to PX6 of the light-receiving region APS.

In one or more example embodiments, the first separation pattern 120F may overlap a part of the first insulating pattern 105. For example, the first separation trench 120t1 may be formed in a part of the first insulating pattern 105. The first separation pattern 120F may penetrate a part of the first insulating pattern 105.

In one or more example embodiments, the first separation pattern 120F may include a spacer film 122, a filling film 124 and a capping film 126. The spacer film 122 may extend along the sides of the first separation trench 120t1 in a conformal manner. The filling film 124 may be formed on the spacer film 122 to fill at least a part of the first separation trench 120t1. The capping film 126 may be adjacent to the second side 110b of the first substrate 110 to fill the other part of the first separation trench 120t1. For example, the capping film 126 may cover the lower side of the filling film 124.

The filling film 124 may include a conductive substance. For example, the filling film 124 may include, but is not limited to, polysilicon (poly Si). In one or more example embodiments, a ground voltage or a negative voltage may be applied to the filling film 124 including the conductive substance. For example, a contact film 350, which is described below, may apply the ground voltage or the negative voltage to the filling film 124. In such a case, an electrostatic discharge (ESD) bruise defect of the image sensor can be effectively prevented. Here, the ESD bruise defect means a phenomenon in which the charges generated by ESD or the like are accumulated on the first substrate 110 to cause a stain such as bruise on the image to be generated.

The spacer film 122 and the capping film 126 may include an insulating substance. For example, the spacer film 122 and the capping film 126 may include, but are limited to, at least one of silicon oxide, aluminum oxide, tantalum oxide, and combinations thereof. The spacer film 122 may electrically insulate the filling film 124 from the first substrate 110. In one or more example embodiments, the spacer film 122 may include an oxide having a lower refractive index than the first substrate 110. The spacer film 122 having a lower refractive index than the first substrate 110 may refract or reflect light which is obliquely incident on the photoelectric conversion layer PD. Also, the spacer film 122 may prevent optical charges generated in one unit pixel by the incident light from moving to another unit pixel by a random drift. For example, a first unit pixel may be disposed adjacent to a second unit pixel, and the spacer film 122 may prevent optical charges generated in the first unit pixel from drifting to the second unit pixel.

The first wiring structure IS1 may be formed on the first substrate 110. In one or more example embodiments, the first wiring structure IS1 may cover the second side 110b of the first substrate 110. The first wiring structure IS1 may include a plurality of wirings. For example, the first wiring structure IS1 may include a first inter-wiring insulating film 130, and a first wiring 132 in the first inter-wiring insulating film 130. In FIG. 5, the number of layers of wiring constituting the first wiring structure IS1 and the placement thereof are shown as an example, and are not limited thereto.

In one or more example embodiments, the first wiring 132 may be electrically connected to the unit pixels PX1 to PX6 and DX1 to DX6. For example, the first wiring 132 may be connected to the first electronic element TR1.

The surface insulating film 140 may be formed on the first substrate 110. In one or more example embodiments, the surface insulating film 140 may extend along a first side 110a of the first substrate 110. The surface insulating film 140 may include an insulating substance. For example, the surface insulating film 140 may include, but is not limited to, at least one of silicon oxide, silicon nitride, silicon oxynitride, aluminum oxide, hafnium oxide, and a combination thereof.

In one or more example embodiments, the surface insulating film 140 may include multiple films. For example, unlike the shown case, the surface insulating film 140 may include an aluminum oxide film, a hafnium oxide film, a silicon oxide film, a silicon nitride film and a hafnium oxide film that are sequentially stacked on the first side 110a of the first substrate 110.

The surface insulating film 140 may function as an antireflection film to prevent reflection of light incident on the first substrate 110, thereby improving the light-receiving rate of the first photoelectric conversion units PD1L to PD4L and the second photoelectric conversion units PD1R to PD4R. Further, the surface insulating film 140 may function as a flattening film to allows for a color filter 170 and a microlens 180, which will be described later, to be formed at a uniform height.

The contact film 350 may be placed in the light-shielding region OB. For example, as shown in FIG. 3A, a plurality of contact films 350 may be placed along the periphery of the light-receiving region APS.

Referring to FIG. 3A, the contact film 350 includes a plurality of first contact films 350_1 disposed in an area extending in the first direction X of the light-shielding region OB and a plurality of second contact films 350_2 disposed in an area extending in the second direction Y of the light-shielding region OB. The distance C1 at which the plurality of first contact films 350_1 are separated from each other in the first direction X may be equal to the distance C2 at which the plurality of second contact films 350_2 are separated from each other in the second direction Y, but it is not limited to.

Referring to FIG. 3B, the number of the plurality of the first contact films 350_1 in the area extending in the first direction X of the light-shielding region OB may be larger than the number of the plurality of the second contact films 350_2 in the area extending in the second direction Y of the light-shielding region OB. The distance C1 at which the plurality of first contact films 350_1 are separated from each other in the first direction X may be shorter than the distance C2 at which the plurality of second contact films 350_2 are separated from each other in the second direction Y, but it is not limited to.

Referring to FIG. 3C, the number of the plurality of the first contact films 350_1 in the area extending in the first direction X of the light-shielding region OB may be smaller than the number of the plurality of the second contact films 350_2 in the area extending in the second direction Y of the light-shielding region OB. The distance C1 at which the plurality of first contact films 350_1 are separated from each other in the first direction X may be longer than the distance C2 at which the plurality of second contact films 350_2 are separated from each other in the second direction Y, but it is not limited to.

The contact film 350 may be formed on the first substrate 110 of the light-shielding region OB. For example, as shown in FIGS. 4 and 5, the contact film 350 may be formed on the surface insulating film 140 of the light-shielding region OB. The contact film 350 may come into contact with the first separation pattern 120F of the light-shielding region OB. For example, contact trenches 140t and 350t extending from the first side 110a to expose the first separation pattern 120F may be formed in the first substrate 110 of the light-shielding region OB. The contact film 350 may fill at least a part of the contact trenches 140t and 350t. In one or more example embodiments, the contact film 350 may extend along the profile of the contact trenches 140t and 350t in a conformal manner.

Although FIGS. 4 and 5 only show that the contact trenches 140t and 350t expose one first separation pattern 120F among the plurality of first separation patterns 120F arranged in the first direction X and each extending in the second direction Y in the light-shielding region OB, this is shown as an example and example embodiments are not limited thereto. For example, unlike the shown case, it is a matter of course that the contact trenches 140t and 350t may also expose the plurality of first separation patterns 120F arranged in the first direction X and each extending in the second direction Y. Also, unlike the shown case, it is a matter of course that the contact trenches 140t and 350t may also expose the plurality of first separation patterns 120F arranged in the second direction Y and each extending in the first direction X.

The contact film 350 may include a conductive substance. The contact film 350 may include, for example, but is not limited to, at least one of titanium (Ti), titanium nitride (TiN), tantalum (Ta), tantalum nitride (TaN), tungsten (W), aluminum (Al), copper (Cu), and combinations .

In one or more example embodiments, the contact film 350 may include multiple films. For example, unlike the shown case, the contact film 350 may include a barrier film and a conductive film that are sequentially stacked in the contact trenches 140t and 350t. The barrier film may include, for example, but is not limited to, at least one of, titanium (Ti), titanium nitride (TiN), tantalum (Ta) and tantalum nitride (TaN). The conductive film may include, for example, but is not limited to, at least one of tungsten (W), aluminum (Al), and copper (Cu).

In one or more example embodiments, the contact film 350 may come into contact with the filling film 124 of the first separation pattern 120F. For example, the contact trenches 140t and 350t may expose the filling film 124. Therefore, the contact film 350 may be electrically connected to the filling film 124. The contact film 350 may apply a ground voltage or a negative voltage to the filling film 124. Because the first separation pattern 120F including the filling film 124 may be arranged over the light-receiving region APS and the light-shielding region OB, the ESD bruise defect of the image sensor can be effectively prevented.

In one or more example embodiments, the contact trenches 140*t* and 350*t* may include a first sub-trench 140*t* and a second sub-trench 350*t*. The first sub-trench 140*t* may extend from the first side 110*a* of the first substrate 110 of the light-shielding region OB. The first sub-trench 140*t* may overlap at least a part of the first separation pattern 120F of the light-shielding region OB. The second sub-trench 350*t* may be formed in the first sub-trench 140*t*. The second sub-trench 350*t* may extend from the lower side of the first sub-trench 140*t* to expose the upper side of the first separation pattern 120F.

The first sub-trench 140*t* may be formed at a first width W11. The second sub-trench 350*t* may be formed at a second width W12. Here, the width means a width in a direction parallel to the surface of the first substrate 110 (for example, the first side 110*a* or the second side 110*b*). In one or more example embodiments, the second width W12 may be smaller than the first width W11.

The first sub-trench 140*t* may be formed at a third depth D21 from the first side 110*a* of the first substrate 110. As an example, the third depth D21 may be about 1 µm to about 2 µm. The second sub-trench 350*t* may be formed at a fourth depth D22 from the lower side of the first sub-trench 140*t*. As an example, the fourth depth D22 may be about 0.1 µm to about 1 µm.

In one or more example embodiments, the first sub-trench 140*t* may be spaced apart from the first separation pattern 120F. For example, the third depth D21 of the first sub-trench 140*t* may be smaller than the second depth D12 of the second separation pattern 120B. As an example, the lower side of the first sub-trench 140*t* may be spaced apart from the upper side of the first separation pattern 120F by the fourth depth D22.

In one or more example embodiments, a spaced distance (e.g., the fourth depth D22) of the lower side of the first sub-trench 140*t* from the upper side of the first separation pattern 120F may be about 0.5 µm or less. As an example, the spaced distance of the lower side of the first sub-trench 140*t* from the upper side of the first separation pattern 120F may be about 0.1 µm or more and about 0.5 µm or less. When the spaced distance of the lower side of the first sub-trench 140*t* from the upper side of the first separation pattern 120F is about 0.5 µm or less, the process of forming the second sub-trench 350*t* for exposing the first separation pattern 120F may be performed efficiently.

In one or more example embodiments, the surface insulating film 140 may extend in a conformal manner along the profile of the first side 110*a* of the first substrate 110 and the first sub-trench 140*t*. The contact film 350 may be formed on the surface insulating film 140. For example, the second sub-trench 350*t* may be formed in the first sub-trench 140*t* and the surface insulating film 140.

In one or more example embodiments, the contact film 350 may extend along the profile of the surface insulating film 140 and the second sub-trench 350*t*. For example, the contact film 350 may extend in a conformal manner along the first side 110*a* of the first substrate 110, the first sub-trench 140*t* and the second sub-trench 350*t*.

In one or more example embodiments, a contact pattern 355 may be formed on the contact film 350. The contact pattern 355 may be formed on the contact film 350 to fill the contact trenches 140*t* and 350*t*. For example, the contact pattern 355 may fill the first sub-trench 140*t* and the second sub-trench 350*t*. Although the uppermost side of the contact pattern 355 is only shown as being placed on the same plane as the uppermost side of the contact film 350, this is shown as an example and example embodiments are not limited thereto.

The contact pattern 355 may include, for example, but is not limited to, at least one of tungsten (W), copper (Cu), aluminum (Al), gold (Au), silver (Ag), and alloys thereof. In one or more example embodiments, the contact pattern 355 may include a substance different from the contact film 350. As an example, the contact film 350 may include tungsten (W), and the contact pattern 355 may include aluminum (Al).

The color filter 170 may be formed on the surface insulating film 140 of the light-receiving region APS. The color filter 170 may be arranged to correspond to the active pixels PX1 to PX6. For example, a plurality of color filters 170 may be arranged two-dimensionally (for example, in the form of a matrix) in a plane extending in the first direction X and the second direction Y.

The color filter 170 may have various colors depending on the active pixels PX1 to PX6. For example, the color filter 170 may be arranged in a Bayer pattern that includes a red color filter, a green color filter, and a blue color filter. However, this is an example and example embodiments are not limited thereto. For example, the color filter 170 may include a yellow filter, a magenta filter and a cyan filter, and may further include a white filter.

In one or more example embodiments, grid patterns 150 and 160 may be formed between the color filters 170. The grid patterns 150 and 160 may be formed on the surface insulating film 140 of the light-receiving region APS. The grid patterns 150 and 160 are formed in a grid pattern from a planar viewpoint and may be interposed between the color filters 170. In one or more example embodiments, the grid patterns 150 and 160 may be placed to overlap the pixel separation pattern 120 of the light-receiving region APS in the vertical direction Z.

In one or more example embodiments, the grid patterns 150 and 160 may include a metal pattern 150 and a low-refractive index pattern 160. The metal pattern 150 and the low-refractive index pattern 160 may be sequentially stacked on, for example, the surface insulating film 140.

The metal pattern 150 may include a conductive substance. For example, the metal pattern 150 may include, but is not limited to, at least one of titanium (Ti), titanium nitride (TiN), tantalum (Ta), tantalum nitride (TaN), tungsten (W), aluminum (Al), copper (Cu), and combinations thereof. In one or more example embodiments, the contact film 350 may be formed at the same level as the metal pattern 150. As used herein, the expression "formed at the same level" means that the contact film 350 and the metal pattern 150 are formed by the same fabricating process. For example, the contact film 350 may be made up of the same substance as the metal pattern 150.

The low-refractive index pattern 160 may include a low-refractive index substance having a lower refractive index than that of silicon (Si). For example, the low-refractive index pattern 160 may include, but is not limited to, at least one of silicon oxide, aluminum oxide, tantalum oxide, and combinations thereof. The low-refractive index pattern 160 may improve the light concentration efficiency by refracting or reflecting the obliquely incident light, thereby improving the quality of the image sensor.

In one or more example embodiments, a first protective film 165 may be formed on the surface insulating film 140 and the contact film 350. For example, the first protective film 165 may extend in a conformal manner along the profiles of the surface insulating film 140, the grid patterns 150 and 160, the contact film 350 and the contact pattern 355.

The first protective film 165 may include, for example, but is not limited to, aluminum oxide. The first protective film 165 may prevent damage to the surface insulating film 140 and the grid patterns 150 and 160.

The light-shielding filter 170C may be formed on the surface insulating film 140 of the light-shielding region OB. For example, the light-shielding filter 170C may cover the first protective film 165 of the light-shielding region OB. The light-shielding filter 170C may include, but is not limited to, for example, a blue color filter.

The microlens 180 may be formed on the color filter 170. The microlens 180 may be arranged to correspond to the active pixels PX1 to PX6. For example, a plurality of microlenses 180 may be arranged two-dimensionally (for example, in the form of a matrix) in a plane extending in the first direction X and the second direction Y. In one or more example embodiments, a part of the microlens 180 may be placed in the light-shielding region OB. As an example, a part of the microlens 180 may be placed on the light-shielding filter 170C adjacent to the light-receiving region APS.

The microlens 180 has a convex shape and may have a predetermined radius of curvature. Accordingly, the microlens 180 may concentrate the light incident on the photoelectric conversion layer PD. The microlens 180 may include, for example, but is not limited to, a light transmissive resin.

In one or more example embodiments, a flattening film 380 may be formed on the light-shielding filter 170C. For example, the flattening film 380 may extend along the surface of the light-shielding filter 170C. The flattening film 380 may include, for example, but is not limited to, a light transmissive resin. In one or more example embodiments, the flattening film 380 may include the same substance as the microlens 180.

In one or more example embodiments, a second protective film 185 may be formed on the microlens 180 and the flattening film 380. The second protective film 185 may extend along the surfaces of the microlens 180 and the flattening film 380. The second protective film 185 may include, for example, an inorganic oxide film. For example, the second protective film 185 may include, but is not limited to, at least one of silicon oxide, titanium oxide, zirconium oxide, hafnium oxide, and combinations thereof. As an example, the second protective film 185 may include a low temperature oxide (LTO).

The second protective film 185 including the mineral oxide film may protect the microlens 180 and the flattening film 380 including an organic matter from the outside. Also, the second protective film 185 may improve the quality of the image sensor by improving the light concentration efficiency of the microlens 180. For example, the second protective film 185 may fill the space between adjacent microlenses 180, thereby reducing the reflection, refraction, scattering, and the like of incident light that reaches the space between the microlenses 180.

Referring to FIGS. 3, 4 and 6, in the image sensor according to one or more example embodiments, the lower side of the first sub-trench 140t may be formed to be lower than the upper side of the first separation pattern 120F.

For example, the third depth D21 of the first sub-trench 140t may be greater than the second depth D12 of the second separation pattern 120B. In one or more example embodiments, the second sub-trench 350t may extend from the lower side of the first sub-trench 140t to expose some of the sides and the upper side of the first separation pattern 120F. The contact film 350 may extend along the second sub-trench 350t to come into contact with a part of the sides of the spacer film 122 and the upper side of the filling film 124.

Referring to FIGS. 3, 4 and 7, in the image sensor according to one or more example embodiments, the second sub-trench 350t may have a curved surface.

For example, the second sub-trench 350t may have a concave profile. In one or more example embodiments, the contact film 350 may extend in a conformal manner along the profile of the second sub-trench 350t. Accordingly, the contact film 350 in the second sub-trench 350t may also have a concave profile. This may be due to, but is not limited to, the characteristics of the etching process of forming the second sub-trench 350t. Although only the second sub-trench 350t is shown as being concave, it goes without saying that the first sub-trench 140t may also have a concave profile.

As the image sensor is gradually highly integrated, an aspect ratio (AR) of a pixel separation pattern that separates the unit pixels gradually increases. This induces a leaning phenomenon of the pixel separation pattern or a pattern shift phenomenon of the unit pixel, which causes a defect of the image sensor.

However, because the image sensor according to one or more example embodiments is equipped with the pixel separation pattern 120 including the first separation pattern 120F and the second separation pattern 120B, it is possible to prevent defects due to high aspect ratios. Specifically, as mentioned above, the first separation pattern 120F may extend from the second side 110b of the first substrate 110, and the second separation pattern 120B may extend from the first side 110a of the first substrate 110. Accordingly, the aspect ratios of each of the first separation pattern 120F and the second separation pattern 120B may be reduced (for example, as compared to the aspect ratio of the pixel separation pattern continuously extending from the first side 110a to the second side 110b).

Also, the image sensor according to one or more example embodiments may improve the performance of the image sensor, by including the contact film 350 which is in contact with the first separation pattern 120F. Specifically, the first separation pattern 120F may not extend to the first side 110a of the first substrate 110. However, as explained above, the contact film 350 may be formed in the contact trenches 140t and 350t that extend from the first side 110a of the first substrate 110 to expose the first separation pattern 120F. Accordingly, the contact film 350 may come into contact with the first separation pattern 120F and apply a ground voltage or a negative voltage to the filling film 124, and to effectively prevent an ESD bruise defect of the image sensor.

Further, the image sensor according to one or more example embodiments may facilitate the contact between the contact film 350 and the first separation pattern 120F, by including the contact trenches 140t and 350t including the first sub-trench 140t and the second sub-trench 350t. Specifically, as explained above, the first sub-trench 140t may extend from the first side 110a of the first substrate 110, and the second sub-trench 350t may extend from the lower side of the first sub-trench 140t to expose the first separation pattern 120F. That is, because the second sub-trench 350t may expose the first separation pattern 120F even at a shallow depth, the second sub-trench 350t may facilitate the contact between the contact film 350 and the first separation pattern 120F.

Figure 8:
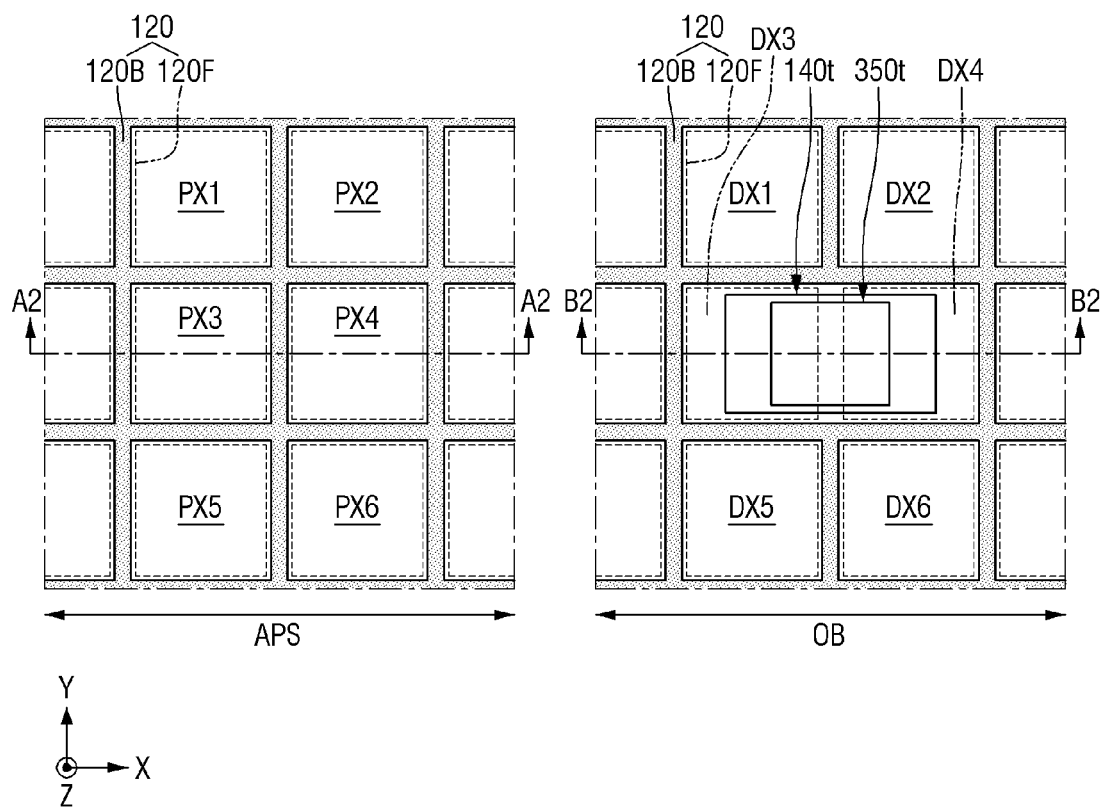
FIG. 8 is another layout view for explaining the light-receiving region and the light-shielding region of FIG. 3A.
Figure 9:
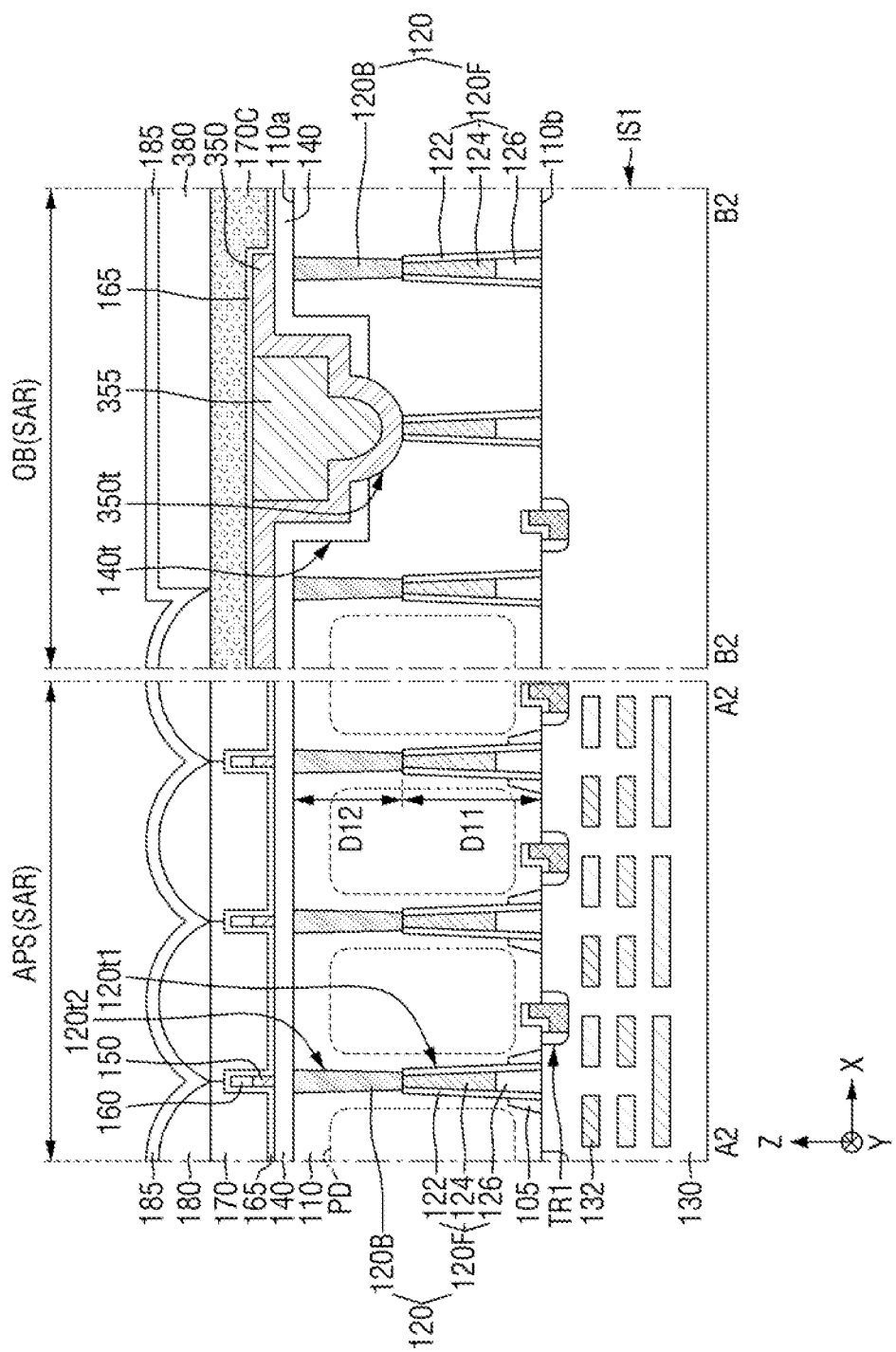
FIG. 9 is a cross-sectional view taken along A2-A2 and B2-B2 of FIG. 8.

FIG. 8 is another layout view for explaining the light-receiving region and the light-shielding region of FIG. 3A. FIG. 9 is a cross-sectional view taken along A2-A2 and B2-B2 of FIG. 8. For convenience of explanation, repeated parts of contents explained above using FIGS. 1 to 7 will be briefly explained or omitted.

Referring to FIGS. 8 and 9, in the image sensor according to one or more example embodiments, the pixel separation pattern 120 of the light-shielding region OB may further include a second separation pattern 120B.

For example, as shown in FIG. 8, the second separation pattern 120B of the light-shielding region OB may surround at least a part of each of the black pixels DX1 to DX6.

In one or more example embodiments, the second separation pattern 120B of the light-shielding region OB may not overlap the contact trenches 140t and 350t. For example, in the region of the first separation pattern 120F that overlaps the contact trenches 140t and 350t, the second separation pattern 120B may not be placed on the first separation pattern 120F. As an example, as shown in FIG. 8, the contact trenches 140t and 350t may overlap one first separation pattern 120F among the plurality of first separation patterns 120F which is arranged in the first direction X in the light-shielding region OB and each extends in the second direction Y. Here, the overlap means that they overlap in the vertical direction Z. At this time, the second separation pattern 120B may not overlap the one first separation pattern 120F that overlaps the contact trenches 140t and 350t.

Figure 10:
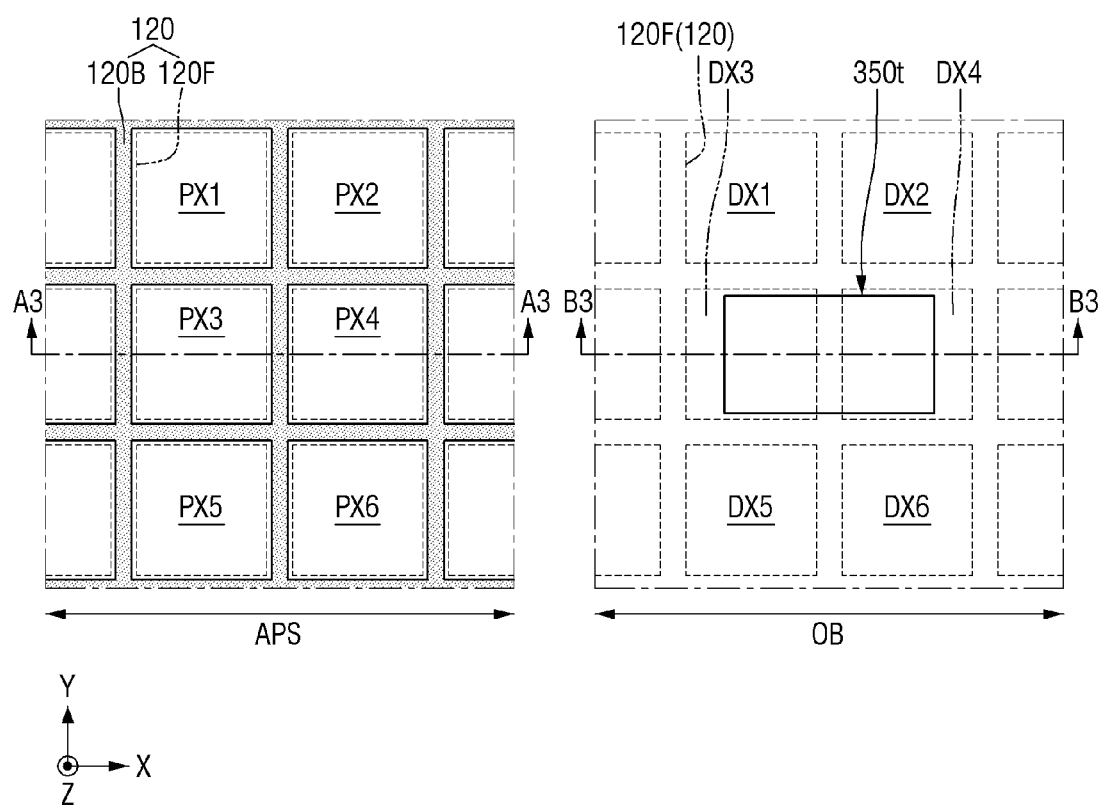
FIG. 10 is another layout view for explaining the light-receiving region and the light-shielding region of FIG. 3A.
Figure 11:
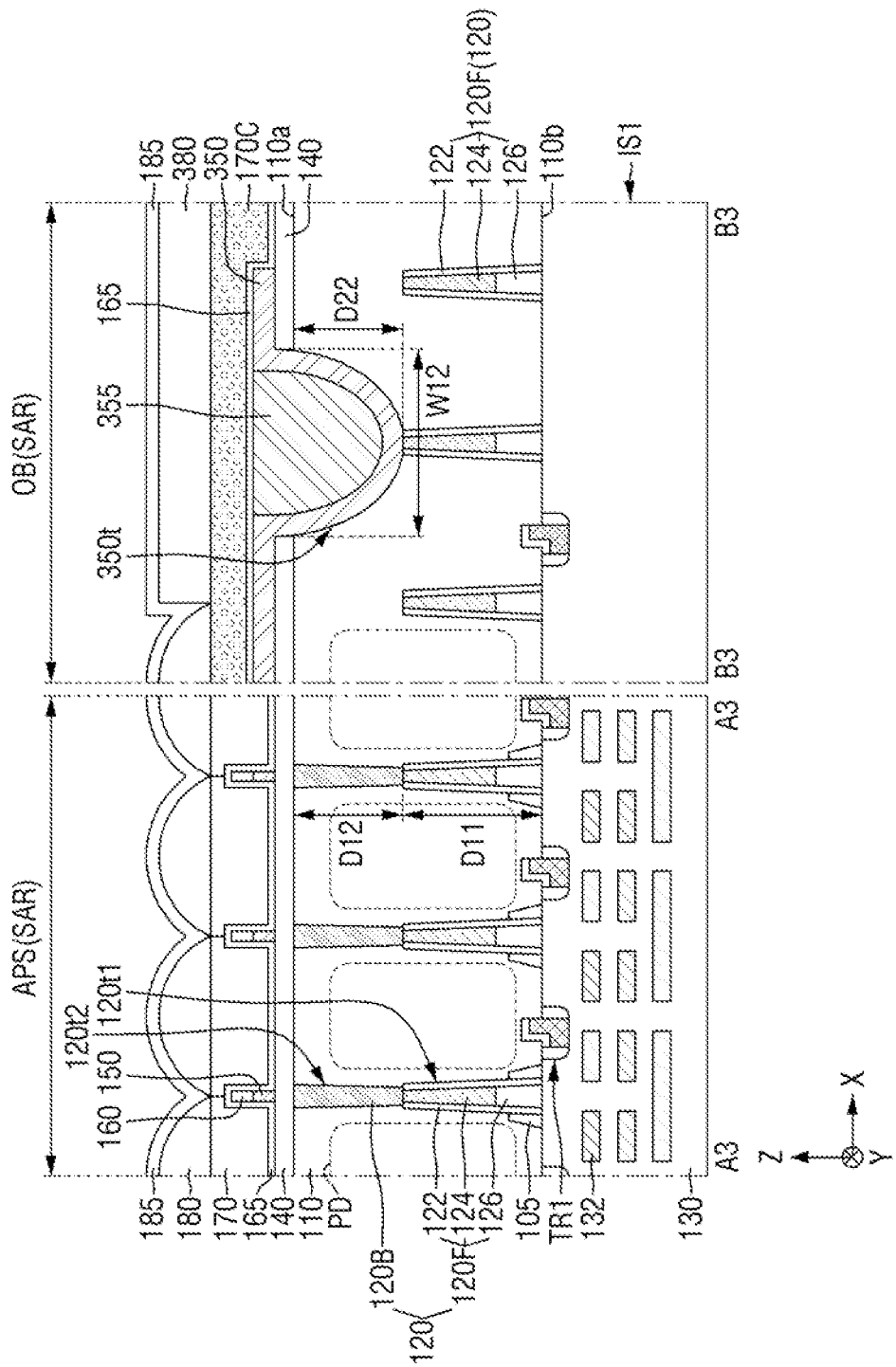
FIG. 11 is a cross-sectional view taken along A3-A3 and B3-B3 of FIG. 10.

FIG. 10 is another layout view for explaining the light-receiving region and the light-shielding region of FIG. 3A. FIG. 11 is a cross-sectional view taken along A3-A3 and B3-B3 of FIG. 10. For convenience of explanation, repeated parts of contents explained above using FIGS. 1 to 7 will be briefly explained or omitted.

Referring to FIGS. 10 and 11, in the image sensor according to one or more example embodiments, the second sub-trench 350t may extend from the first side 110a of the first substrate 110 to expose the first separation pattern 120F.

For example, the second sub-trench 350t may be formed at the fourth depth D22 from the first side 110a of the first substrate 110. The fourth depth D22 of the second sub-trench 350t may be equal to or greater than the second depth D12 of the second separation pattern 120B. As an example, the fourth depth D22 may be about 1.5 µm to about 5 µm.

In one or more example embodiments, the surface insulating film 140 may not extend along the second sub-trench 350t. For example, the contact trenches 140t and 350t may not include the first sub-trench 140t.

In one or more example embodiments, the second sub-trench 350t may be formed at a relatively large width. For example, the width W12 of the second sub-trench 350t of FIG. 11 may be greater than the width W12 of the second sub-trench 350t of FIG. 5.

Figure 12:
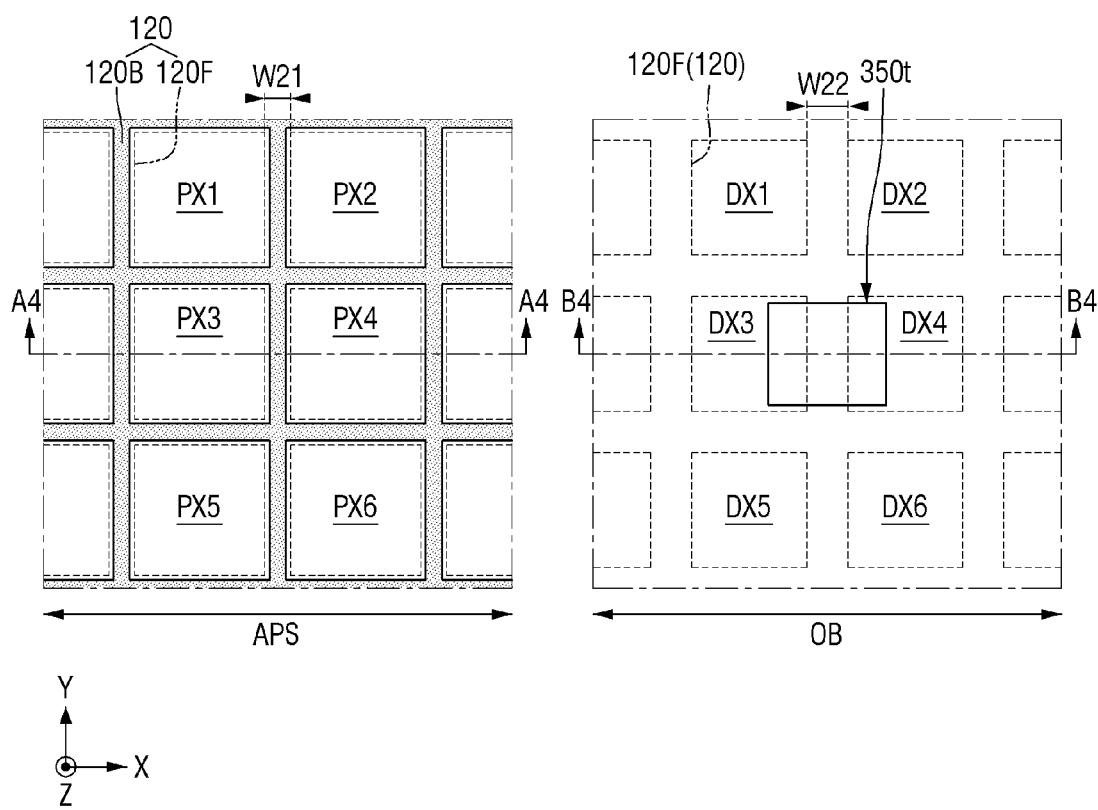
FIG. 12 is another layout view for explaining the light-receiving region and the light-shielding region of FIG. 3A.
Figure 13:
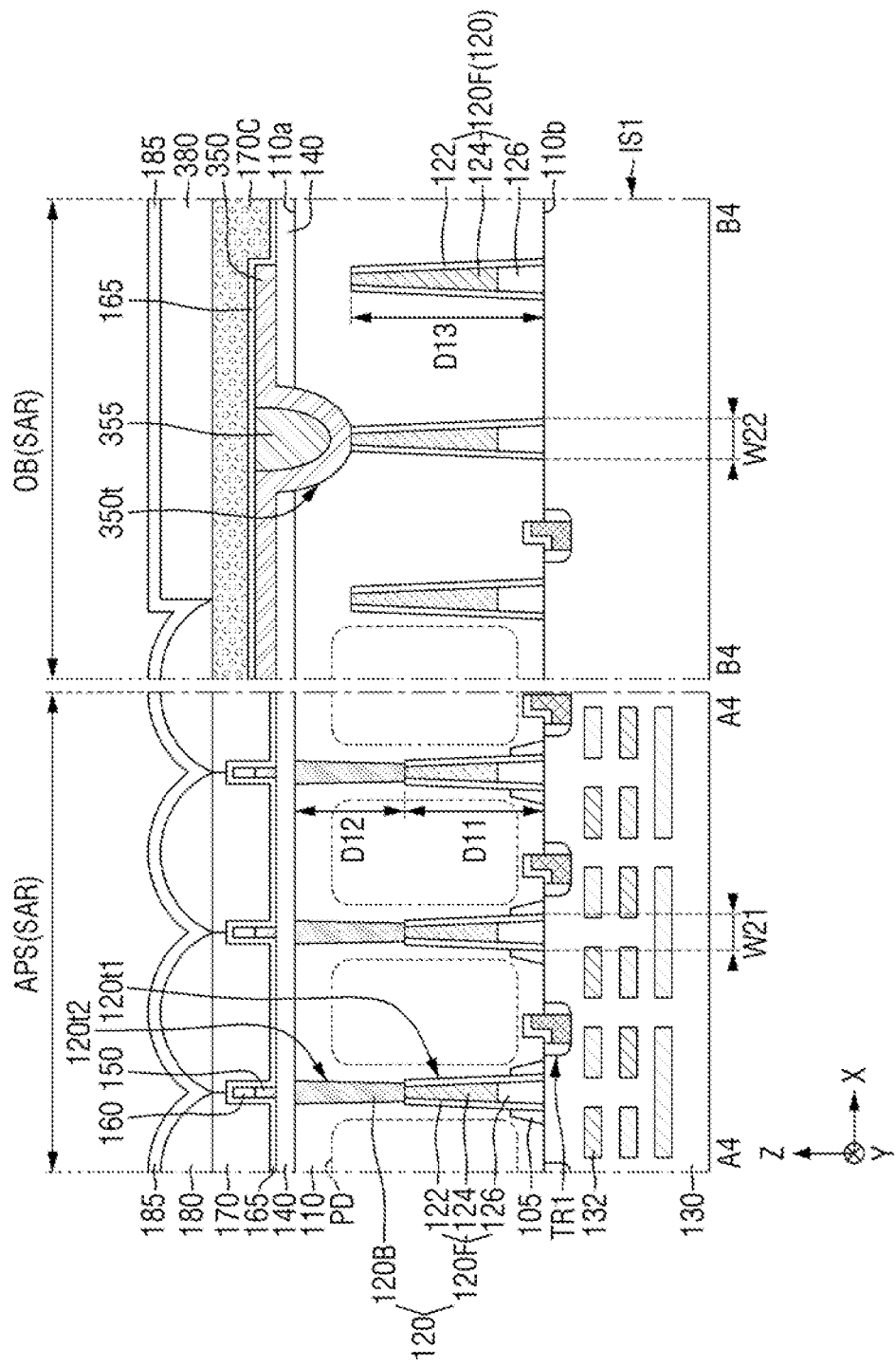
FIG. 13 is a cross-sectional view taken along A4-A4 and B4-B4 of FIG. 12.

FIG. 12 is another layout view for explaining the light-receiving region and the light-shielding region of FIG. 3A. FIG. 13 is a cross-sectional view taken along A4-A4 and B4-B4 of FIG. 12. For convenience of explanation, repeated parts of contents explained above using FIGS. 1 to 7 will be briefly explained or omitted.

Referring to FIGS. 12 and 13, in the image sensor according to one or more example embodiments, the first separation pattern 120F of the light-shielding region OB may be formed to be deeper than the first separation pattern 120F of the light-receiving region APS.

The first separation pattern 120F of the light-receiving region APS may be formed at the first depth D11 from the second side 110b of the first substrate 110. The first separation pattern 120F of the light-shielding region OB may be formed at a fifth depth D13 from the second side 110b of the first substrate 110. At this time, the fifth depth D13 may be greater than the first depth D11. As an example, the fifth depth D13 may be greater than the first depth D11 by about 0.1 µm to about 1 µum.

The first depth D11 and the fifth depth D13 may each be smaller than the thickness of the first substrate 110. As an example, the first depth D11 may be about 3 µm to about 4 µm, and the fifth depth D13 may be about 3.5 µm to about 4.5 µm.

In one or more example embodiments, the first separation pattern 120F of the light-shielding region OB may be formed at a width wider than that of the first separation pattern 120F of the light-receiving region APS. For example, the first separation pattern 120F of the light-receiving region APS may be formed at the third width W21, and the first separation pattern 120F of the light-shielding region OB may be formed at the fourth width W22. Here, the width means a width in a direction parallel to the surface of the first substrate 110 (for example, the first side 110a or the second side 110b). At this time, the fourth width W22 may be greater than the third width W21.

Although each of the third width W21 and the fourth width W22 is shown as a width of the first separation pattern 120F in the first direction X, the width of the first separation pattern 120F in the second direction Y may, of course, be similar.

Figure 14:
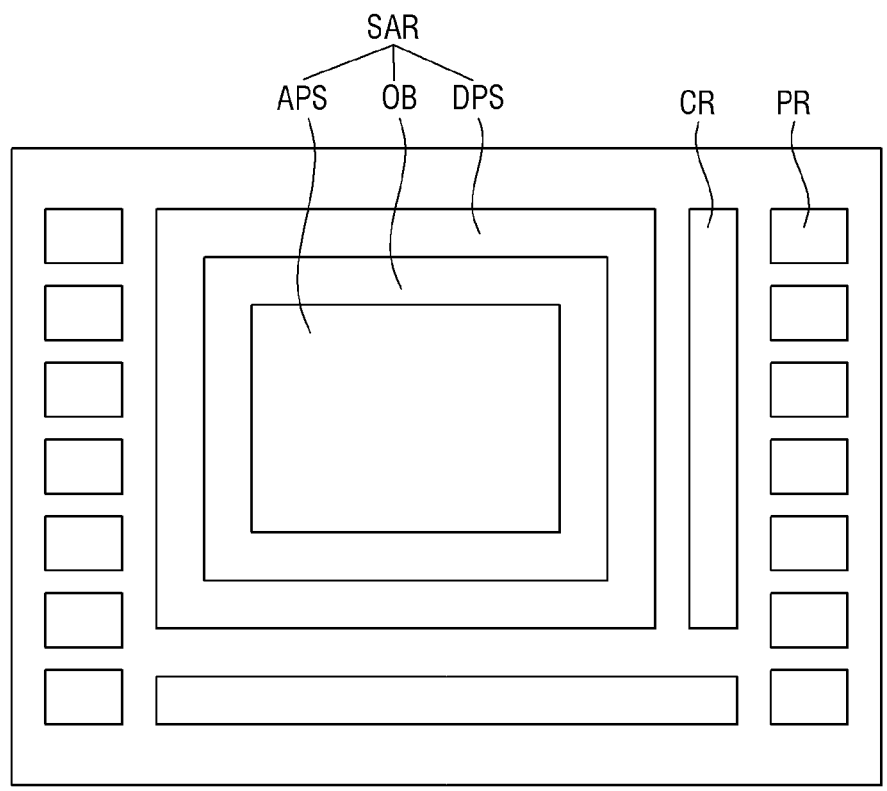
FIG. 14 is a schematic layout view for explaining the image sensor according to one or more example embodiments.
Figure 15:
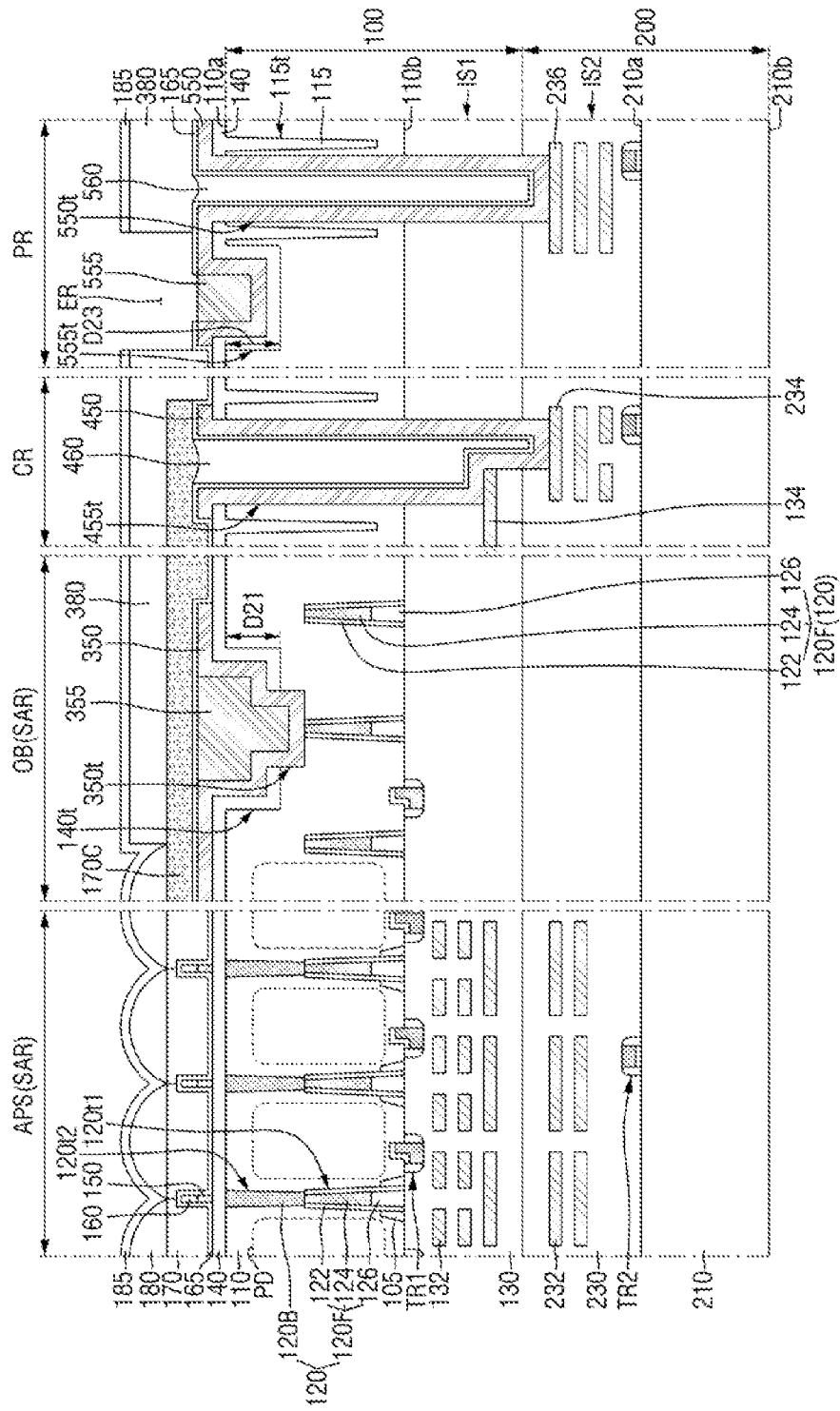
FIGS. 15 and 16 are various cross-sectional views for explaining the image sensor according to one or more example embodiments.
Figure 16:
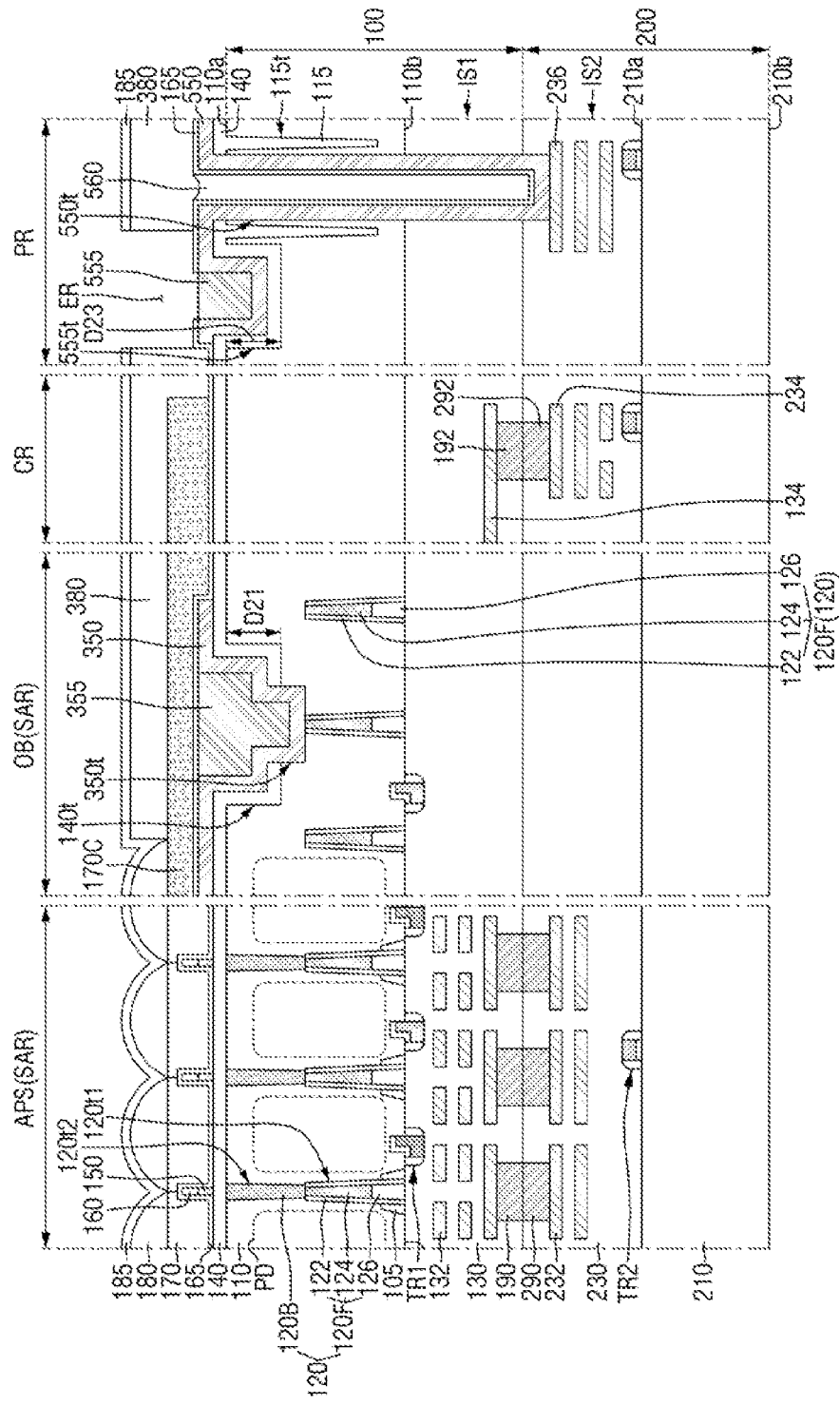

FIG. 14 is a schematic layout view for explaining the image sensor according to one or more example embodiments. FIGS. 15 and 16 are various cross-sectional views for explaining the image sensor according to one or more example embodiments. For convenience of explanation, repeated parts of contents explained above using FIGS. 1 to 13 will be briefly explained or omitted.

Referring to FIGS. 14 and 15, the image sensor according to one or more example embodiments may further include a connection region CR, a pad region PR and a dummy pixel region DPS.

The connection region CR may be formed around the sensor array region SAR. Although the connection region CR may be formed on one side of the sensor array region SAR, this is an example and example embodiments are not limited thereto. Wirings are formed in the connection region CR and may be configured to transmit and receive electrical signals of the sensor array region SAR.

The pad region PR may be formed around the sensor array region SAR. The pad region PR may be formed adjacent to the edge of the image sensor according to one or more example embodiments. The pad region PR may be configured to be connected to an external device or the like, and to transmit and receive electrical signals between the image sensor and the external device according to one or more example embodiments.

The dummy pixel region DPS may be formed around the light-shielding region OB.

Although the connection region CR is shown as being interposed between the sensor array region SAR and the pad region PR, this is shown as an example and example embodiments are not limited thereto. The placement of the sensor array region SAR, the connection region CR and the pad region PR may of course vary as required.

In the image sensor according to one or more example embodiments, the first substrate 110 and the first wiring structure IS1 may form the first substrate structure 100. The first wiring structure IS1 may include a plurality of wirings. For example, the first wiring structure IS1 may include a first wiring 132 in the sensor array region SAR, a second wiring 134 in the connection region CR. The second wiring 134 may extend from the sensor array region SAR. For example, the second wiring 134 may be electrically connected to at least a part of the first wiring 132. Therefore, the second wiring 134 may be electrically connected to the unit pixels (for example, PX1 to PX6 and DX1 to DX6 of FIG. 4) of the sensor array region SAR.

The image sensor according to one or more example embodiments may include a second substrate 210 and a second wiring structure IS2. The second substrate 210 and the second wiring structure IS2 may form the second substrate structure 200.

The second substrate 210 may be bulk silicon or silicon-on-insulator (SOI). The second substrate 210 may be a silicon substrate or may include other substances, for example, silicon germanium, indium antimonide, lead tellurium compounds, indium arsenic, indium phosphide, gallium arsenide or gallium antimonide. The second substrate 210 may have an epitaxial layer formed on the base substrate.

The second substrate 210 may include a third side 210*a* and a fourth side 210*b* that are opposite to each other. In one or more example embodiments, the third side 210*a* of the second substrate 210 may be a side that faces the second side 110*b* of the first substrate 110.

A plurality of electronic elements may be formed on the second substrate 210. For example, the second electronic element TR2 may be formed on the third side 210*a* of the second substrate 210. The second electronic element TR2 is electrically connected to the sensor array region SAR, and may transmit and receive electrical signals to and from each unit pixel of the sensor array region SAR (for example, PX1 to PX6 and DX1 to DX6 of FIG. 4). For example, the second electronic element TR2 may include electronic elements that make up the row decoder 20, the row driver 30, the column decoder 40, the timing generator 50, the correlated double sampler 60, the analog to digital converter 70 or the I/O buffer 80 of FIG. 1.

The second wiring structure IS2 may be formed on the second substrate 210. In one or more example embodiments, the second wiring structure IS2 may be formed on the third side 210*a* of the second substrate 210. The second wiring structure IS2 may include a plurality of wirings. For example, the second wiring structure IS2 may include a second inter-wiring insulating film 230, and a plurality of wirings 232, 234 and 236 in the second inter-wiring insulating film 230. In FIG. 15, the number of layers of wirings constituting the second wiring structure IS2 and the placement thereof are shown as an example and example embodiments are not limited thereto.

At least some of the wirings 232, 234 and 236 of the second wiring structure IS2 may be connected to the second electronic element TR2. In one or more example embodiments, the second wiring structure IS2 may include a third wiring 232 in the sensor array region SAR, a fourth wiring 234 in the connection region CR, and a fifth wiring 236 in the pad region PR.

The second wiring structure IS2 may be attached to the first wiring structure IS1. For example, as shown in FIG. 15, the upper side of the second inter-wiring insulating film 230 may be attached to the lower side of the first inter-wiring insulating film 130.

The image sensor according to one or more example embodiments may include a first connection structure 450 and a second connection structure 550.

The first connection structure 450 may be placed inside the connection region CR. For example, the first connection structure 450 may be formed on the surface insulating film 140 of the connection region CR. The first connection structure 450 may electrically connect the first substrate structure 100 and the second substrate structure 200.

For example, a first connection trench 455*t* which extends from the first side 110*a* of the first substrate 110 to expose the second wiring 134 and the fourth wiring 234*a* may be formed in the first substrate structure 100 and the second substrate structure 200 of the connection region CR. The first connection structure 450 is formed in the first connection trench 455*t* and may come into contact with the second wiring 134 and the fourth wiring 234. Accordingly, the first connection structure 450 penetrates the first substrate 110, the first wiring structure IS1, and the second wiring structure IS2, and may electrically connect the second wiring 134 and the fourth wiring 234.

In one or more example embodiments, the first connection structure 450 may be connected to the contact film 350. In one or more example embodiments, the fourth wiring 234 may be the uppermost wiring among the plurality of wiring in the connection region CR. In one or more example embodiments, the first connection structure 450 may extend in a conformal manner along the profiles of the sides and the lower sides of the first connection trench 455*t*.

The first connection structure 450 may include, for example, but is not limited to, at least one of titanium (Ti), titanium nitride (TiN), tantalum (Ta), tantalum nitride (TaN), tungsten (W), aluminum (Al), copper (Cu) and combinations thereof. In one or more example embodiments, the first connection structure 450 may be formed at the same level as the contact film 350.

In one or more example embodiments, the first protective film 165 may cover the first connection structure 450. For example, the first protective film 165 may extend in a conformal manner along the profile of the first connection structure 450.

In one or more example embodiments, a first filling insulating film 460 that fills the first connection trench 455*t* may be formed on the first connection structure 450. The first filling insulating film 460 may include, for example, but is not limited to, at least one of silicon oxide, aluminum oxide, tantalum oxide, and combinations thereof.

The second connection structure 550 may be placed inside the pad region PR. For example, the second connection structure 550 may be formed on the surface insulating film 140 of the pad region PR. The second connection structure 550 may electrically connect the second substrate structure 200 to an external device or the like.

For example, a second connection trench 550*t* which extends from the first side 110*a* of the first substrate 110 to expose the fifth wiring 236 may be formed in the first substrate structure 100 and the second substrate structure 200 of the pad region PR. The second connection structure 550 is formed in the second connection trench 550*t* and may come into contact with the fifth wiring 236. Accordingly, the second connection structure 550 penetrates the first substrate 110, the first wiring structure IS1, and the second wiring structure IS2, and may be electrically connected to the fifth wiring 236.

In one or more example embodiments, the fifth wiring 236 may be the uppermost wiring among the plurality of wires in the pad region PR. In one or more example embodiments, the second connection structure 550 may extend in a conformal manner along the profiles of the sides and the lower side of the second connection trench 555*t*.

In one or more example embodiments, a pad trench 555t extending from the first side 110a of the first substrate 110 may be formed in the first substrate 110 of the pad region PR. The pad trench 555t may be adjacent to the second connection trench 550t. The second connection structure 550 may be formed in the pad trench 555t and exposed. In one or more example embodiments, the second connection structure 550 may extend in a conformal manner along the profiles of the sides and the lower side of the second connection trench 550t and the pad trench 555t.

The second connection structure 550 may include, for example, but is not limited to, at least one of titanium (Ti), titanium nitride (TiN), tantalum (Ta), tantalum nitride (TaN), tungsten (W), aluminum (Al), copper (Cu), and combinations thereof. In one or more example embodiments, the second connection structure 550 may be formed at the same level as the contact film 350 and the first connection structure 450.

The pad trench 555t may be formed at a sixth depth D23 from the first side 110a of the first substrate 110. In one or more example embodiments, the third depth D21 of the first sub-trench 140t may be the same as the sixth depth D23 of the pad trench 555t. As used herein, the term "same" means not only the exact same thing, but also a minute difference that may occur due to a process margin or the like. As an example, the sixth depth D23 may be about 1 μm to about 2 μm. In one or more example embodiments, the pad trench 555t may be formed at the same level as the first sub-trench 140t.

In one or more example embodiments, a second filling insulating film 560 that fills the second connection trench 550t may be formed on the second connection structure 550. The second filling insulating film 560 may include, but is not limited to, for example, at least one of silicon oxide, aluminum oxide, tantalum oxide, and combinations thereof. In one or more example embodiments, the second filling insulating film 560 may be formed at the same level as the first filling insulating film 460.

In one or more example embodiments, a pad pattern 555 may be formed in the pad trench 555t. The pad pattern 555 may fill the pad trench 555t on the second connection structure 550. Accordingly, the second connection structure 550 penetrates the first substrate 110, the first wiring structure IS1, and the second wiring structure IS2, and may electrically connect the pad pattern 555 and the fifth wiring 236.

The pad pattern 555 may include, for example, but is not limited to, at least one of tungsten (W), copper (Cu), aluminum (Al), gold (Au), silver (Ag), and alloys thereof. In one or more example embodiments, the pad pattern 555 may be formed at the same level as the contact pattern 355.

In one or more example embodiments, the first protective film 165 may cover the second connection structure 550. For example, the first protective film 165 may extend along the profile of the second connection structure 550. In one or more example embodiments, the first protective film 165 may expose the pad pattern 555.

In one or more example embodiments, a second insulating pattern 115 may be formed in the first substrate 110. For example, a third separation trench 115t may be formed in the first substrate 110. The second insulating pattern 115 may fill the third separation trench 115t.

In FIG. 15, although the second insulating pattern 115 is only shown as being formed around the first connection structure 450 of the connection region CR and around the second connection structure 550 of the pad region PR, this is shown as an example and example embodiments are not limited thereto. For example, the second insulating pattern 115 may of course be formed around the contact film 350 of the light-shielding region OB.

The second insulating pattern 115 may include, for example, but is not limited to, at least one of silicon oxide, silicon nitride, silicon oxynitride, aluminum oxide, hafnium oxide, and combinations thereof.

In one or more example embodiments, the light-shielding filter 170C may cover the contact film 350 and the first connection structure 450. For example, the light-shielding filter 170C may be formed to cover a part of the first protective film 165 in the light-shielding region OB and the connection region CR.

In one or more example embodiments, the second protective film 185 and the flattening film 380 may expose the pad pattern 555. For example, an exposure opening ER that exposes the pad pattern 555 may be formed in the second protective film 185 and the flattening film 380. Therefore, the pad pattern 555 may be configured to be connected to an external device or the like to transmit and receive electrical signals between the image sensor according to one or more example embodiments and the external device. The pad pattern 555 may be an I/O pad for the image sensor according to one or more example embodiments.

In one or more example embodiments, the pad pattern 555 connected to an external device or the like may apply a ground voltage or a negative voltage to the contact film 350. For example, the ground voltage or the negative voltage applied from the pad pattern 555 may be applied to the contact film 350 through the second connection structure 550, the fifth wiring 236, the fourth wiring 234, and the first connection structure 450.

Referring to FIGS. 14 and 16, in the image sensors according to one or more example embodiments, at least a part of the first substrate structure 100 and at least a part of the second substrate structure 200 may be connected in a chip to chip (C2C) manner.

The C2C manner may mean that the upper chip is manufactured on the first wafer (e.g., the first substrate 110), the lower chip is manufactured on the second wafer (e.g., the second substrate 210), and then the upper chip and the lower chip are connected in a bonding manner.

For example, first bonding patterns 190 and 192 exposed from the lower side of the first inter-wiring insulating film 130 may be formed inside the first inter-wiring insulating film 130. Further, second bonding patterns 290 and 292 corresponding to the first bonding patterns 190 and 192 and exposed from the upper side of the second inter-wiring insulating film 230 may be formed in the second inter-wiring insulating film 230. When the first inter-wiring insulating film 130 and the second inter-wiring insulating film 230 are attached, the first bonding patterns 190 and 192 may be connected to the second bonding patterns 290 and 292. Accordingly, the first substrate structure 100 and the second substrate structure 200 may be electrically connected to each other.

As an example, the first bonding patterns 190 and 192 and the second bonding patterns 290 and 292 may be connected in a Cu—Cu bonding manner including copper (Cu). However, this is an example and example embodiments are not limited thereto. For example, the first bonding patterns 190 and 192 and the second bonding patterns 290 and 292 may also include aluminum (Al) or tungsten (W).

Although the first bonding patterns 190 and 192 and the second bonding patterns 290 and 292 are only shown as being formed in the light-receiving region APS and the connection region CR, this is shown as an example and example embodiments are not limited thereto. For example, the first bonding patterns 190 and 192 and the second bonding patterns 290 and 292 may be formed in the light-shielding region OB or the pad region PR, and may not be formed in the light-receiving region APS and the connection region CR.

Figure 17A:
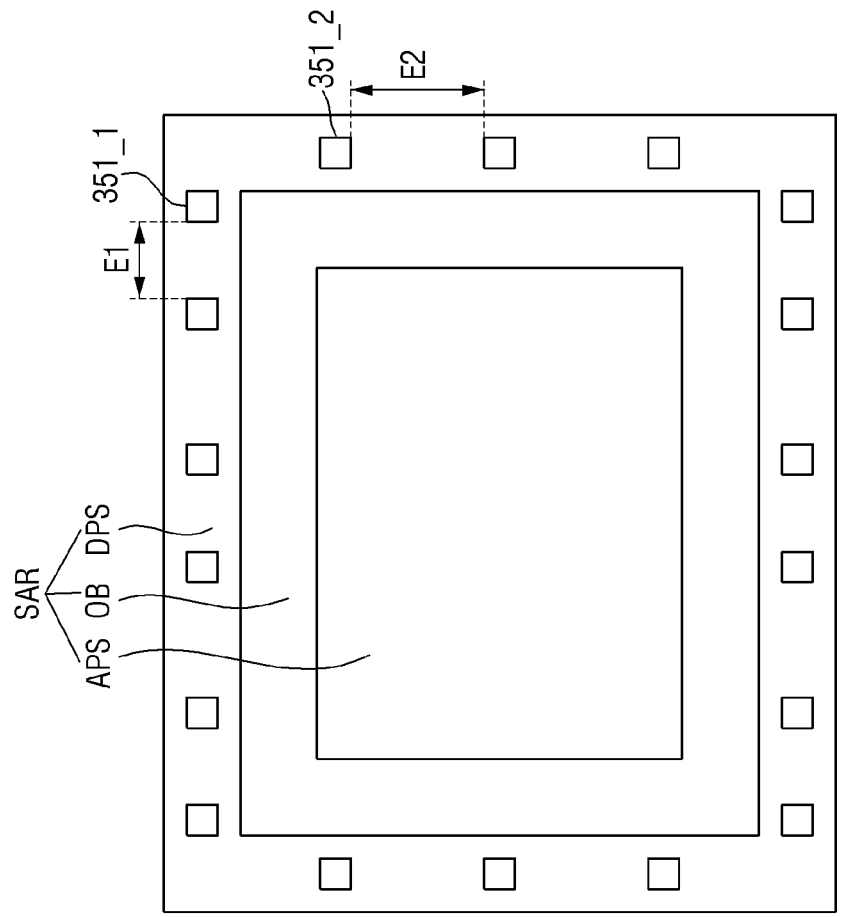
FIGS. 17A and 17B are enlarged views of the dummy pixel region of FIG. 14.
Figure 17B:
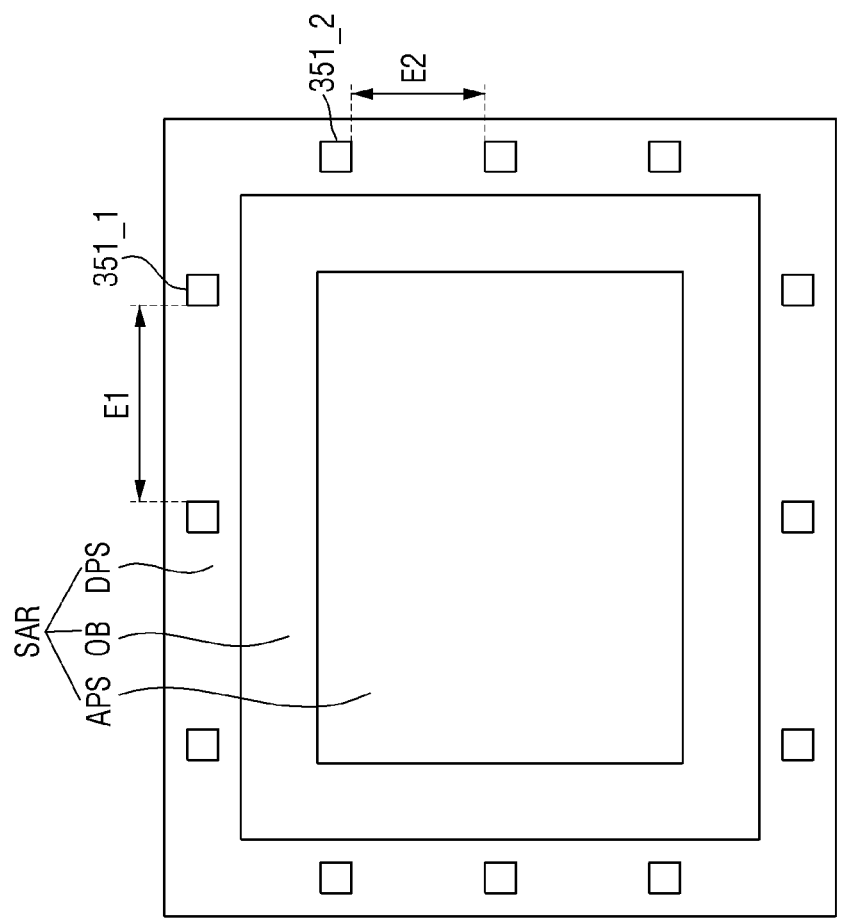

FIGS. 17A and 17B are enlarged views of the dummy pixel region of FIG. 14.

The dummy pixel region DPS may be formed between the light-shielding region OB and the connection region CR. Although not specifically illustrated, the sensor array region SAR may include the dummy pixel region DPS defining a plurality of dummy pixels. The dummy pixel region DPS may be disposed to surround the light-shielding region OB, but it is not limited to.

Although not specifically illustrated, a dummy pixel separation pattern may be formed in the first substrate 110. The dummy pixel separation pattern may define the plurality of dummy pixels in the first substrate 110.

The first and second dummy contact films 351_1 and 351_2 may be disposed in the dummy pixel region DPS. For example, as illustrated in FIGS. 17A and 17B, the plurality of first and second dummy contact films 351_1 and 351_2 may be disposed along the periphery of the light-shielding region OB, but it is not limited to.

The first and second dummy contact films 351_1 and 351_2 may be formed on the first substrate 110 to contact the dummy pixel separation pattern of the dummy pixel region DPS. Although not specifically illustrated, for example, a dummy contact trench exposing the dummy pixel separation pattern may be formed in the first substrate 110 of the dummy pixel region DPS. The first and second dummy contact films 351_1 and 351_2 may fill at least a part of the dummy contact trench, but it is not limited to.

Meanwhile, the first and second dummy contact films 351_1 and 351_2 of the dummy pixel region DPS may be formed similarly to the first and second contact film 350_1 and 350_2 of the light-shielding region OB. Also, the dummy contact trench in the dummy pixel region DPS may be formed similarly to the contact trench 350*t* in the light-shielding region OB, but it is not limited to.

Referring to FIG. 17A, the number of the plurality of the first dummy contact films 351_1 in the area extending in the first direction X of the dummy pixel region DPS may be larger than the number of the plurality of the second dummy contact films 351_2 in the area extending in the second direction Y of dummy pixel region DPS. The distance E1 at which the plurality of first dummy contact films 351_1 are separated from each other in the first direction X may be shorter than the distance E2 at which the plurality of second dummy contact films 351_2 are separated from each other in the second direction Y, but it is not limited to.

Referring to FIG. 17B, the number of the plurality of the first dummy contact films 351_1 in the area extending in the first direction X of the dummy pixel region DPS may be smaller than the number of the plurality of the second dummy contact films 351_2 in the area extending in the second direction Y of dummy pixel region DPS. The distance E1 at which the plurality of first dummy contact films 351_1 are separated from each other in the first direction X may be longer than the distance E2 at which the plurality of second dummy contact films 351_2 are separated from each other in the second direction Y, but it is not limited to.

Hereinafter, a method for fabricating various image sensors according to an example embodiment will be explained referring to FIGS. 1 to 31.

FIGS. 18 to 25 are intermediate stage diagrams for explaining the method for fabricating the image sensor according to one or more example embodiments. For convenience of explanation, repeated parts of contents explained above using FIGS. 1 to 16 will be briefly explained or omitted.

Figure 18:
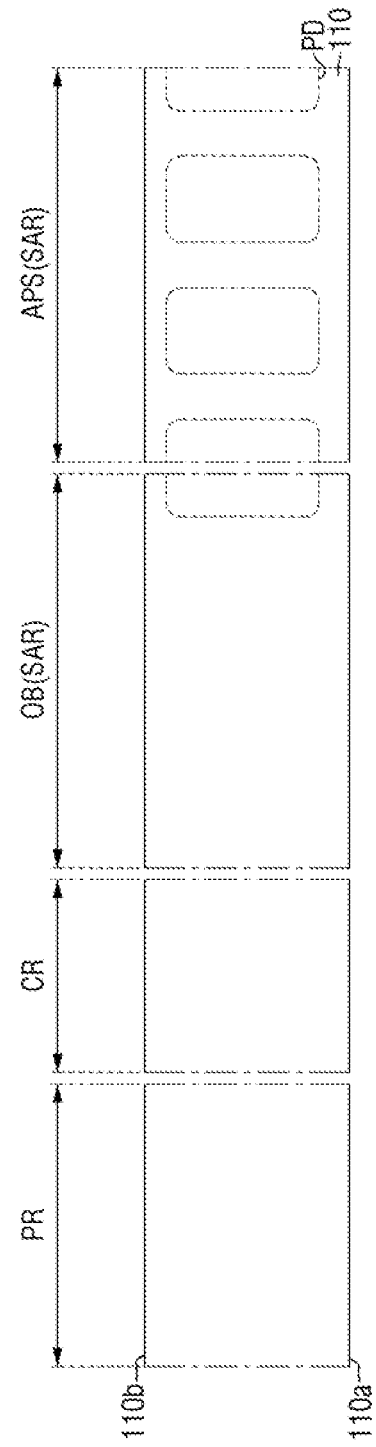
FIGS. 18 to 25 are intermediate stage diagrams for explaining the method for fabricating the image sensor according to one or more example embodiments.

A first substrate 110 is provided referring to FIG. 18.

The first substrate 110 may be a semiconductor substrate. The first substrate 110 may include a first side 110*a* and a second side 110*b* that are opposite to each other. A plurality of unit pixels (for example, PX1 to PX6 and DX1 to DX6 of FIG. 4) may be formed on the first substrate 110 of the sensor array region SAR. The photoelectric conversion layer PD may be formed in each unit pixel.

Figure 19:
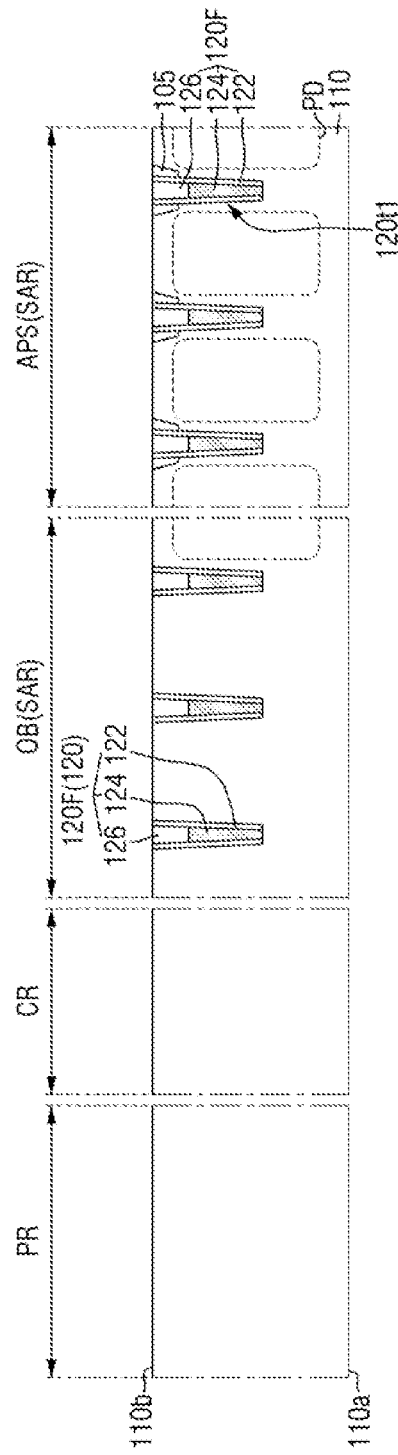

Referring to FIG. 19, the first insulating pattern 105 and the first separation pattern 120F are formed in the first substrate 110.

For example, a shallow trench extending from the second side 110*b* may be formed in the first substrate 110. The first insulating pattern 105 may be formed by embedding an insulating substance in the shallow trench.

Subsequently, a first separation pattern 120F extending from the second side 110*b* may be formed in the first substrate 110. In one or more example embodiments, the first separation pattern 120F may be placed in the light-receiving region APS and the light-shielding region OB. For example, a first separation trench 120*t*1 extending from the second side 110*b* may be formed in the first substrate 110 of the light-receiving region APS and the light-shielding region OB. In one or more example embodiments, the first separation trench 120*t*1 may overlap a part of the first insulating pattern 105. The first separation pattern 120F may be formed to fill the first separation trench 120*t*1.

Although not specifically illustrated, the first separation pattern 120F may be placed in the connection region CR and the pad region PR. For example, the first separation trench 120*t*1 extending from the second side 110*b* may be formed in the first substrate 110 of the connection region CR and the pad region PR. The first separation pattern 120F may be formed to fill the first separation trench 120*t*1.

In one or more example embodiments, the first separation pattern 120F may include a spacer film 122, a filling film 124 and a capping film 126.

Figure 20:
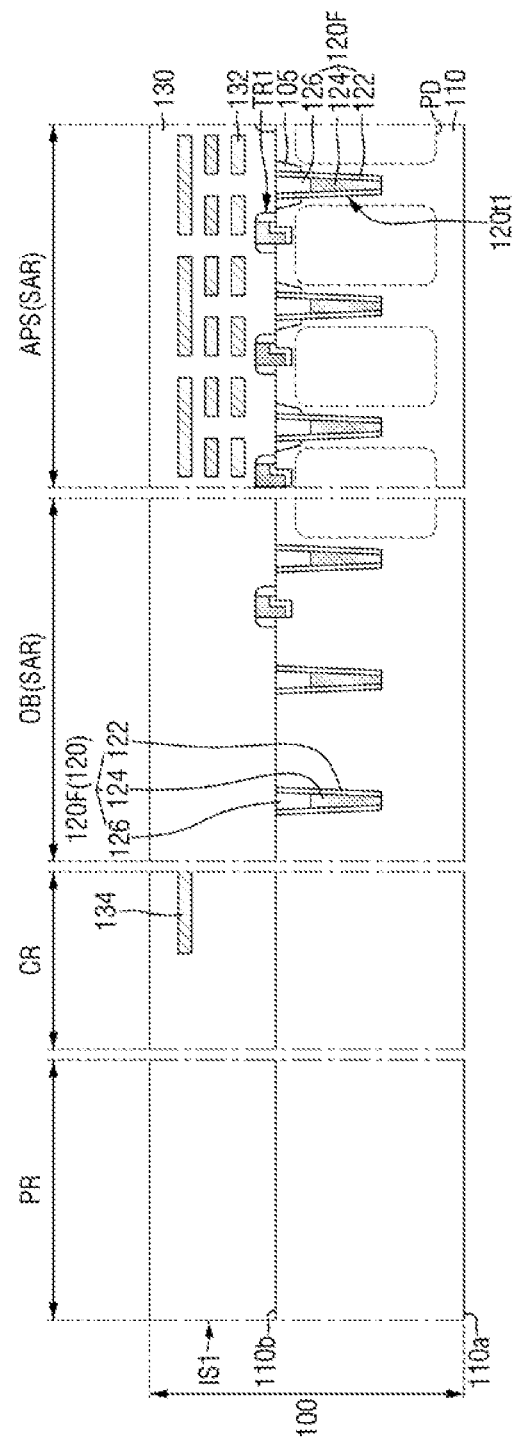

Referring to FIG. 20, the first electronic element TR1 and the first wiring structure IS1 are formed on the second side 110*b* of the first substrate 110.

The first electronic element TR1 may be connected to a photoelectric conversion layer PD to form various transistors for processing electric signals. The first wiring structure IS1 may include a first inter-wiring insulating film 130, and a plurality of wirings 132 and 134 in the first inter-wiring insulating film 130. Accordingly, the first substrate structure 100 including the first substrate 110 and the first wiring structure IS1 may be formed.

Figure 21:
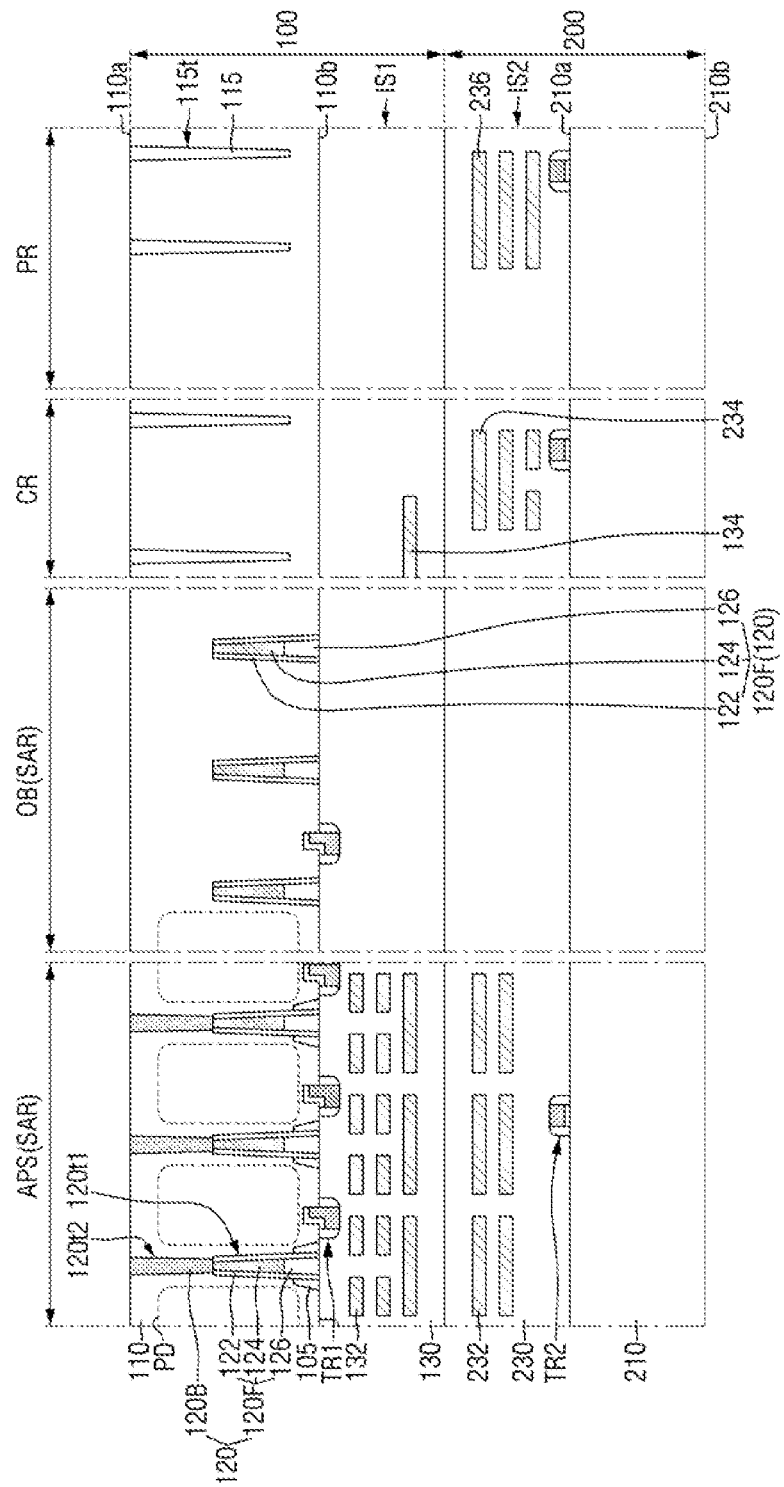

Referring to FIG. 21, the first substrate structure 100 is mounted on the second substrate structure 200.

The second substrate structure 200 may include a second substrate 210 and a second wiring structure IS2. The second wiring structure IS2 may include a second inter-wiring insulating film 230, and a plurality of wirings 232, 234 and 236 in the second inter-wiring insulating film 230.

In one or more example embodiments, the first substrate structure 100 and the second substrate structure 200 may be attached so that the second side 110*b* of the first substrate 110 and the third side 210*a* of the second substrate 210 face each other. For example, as shown, the upper side of the second inter-wiring insulating film 230 may be attached to the lower side of the first inter-wiring insulating film 130.

Subsequently, a second separation pattern 120B extending from the first side 110a may be formed in the first substrate 110. In one or more example embodiments, the second separation pattern 120B may be placed in the light-receiving region APS, and may not be placed in the light-shielding region OB. For example, a second separation trench 120t2 extending from the first side 110a may be formed in the first substrate 110 of the light-receiving region APS. In one or more example embodiments, the lower side of the second separation trench 120t2 may expose the upper side of the first separation pattern 120F. The second separation pattern 120B may be formed to fill the second separation trench 120t2.

In one or more example embodiments, the second insulating pattern 115 may be formed in the first substrate 110. For example, a third separation trench 115t may be formed in the first substrate 110. The third separation trench 115t may be a deep trench formed by patterning the first substrate 110. The second insulating pattern 115 may fill the third separation trench 115t.

Figure 22:
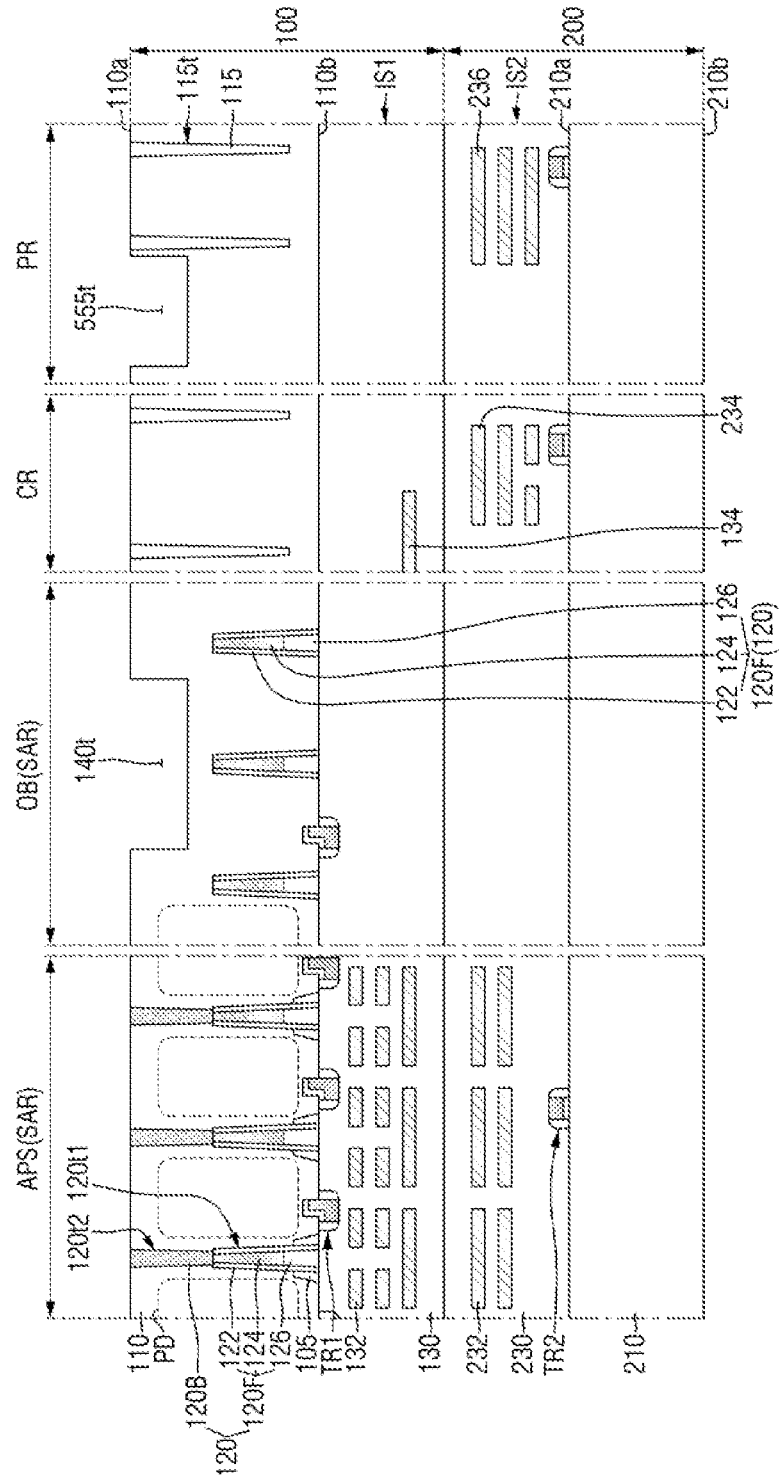

Referring to FIG. 22, a first sub-trench 140t is formed in the first substrate 110 of the light-shielding region OB.

The first sub-trench 140t may extend from the first side 110a of the first substrate 110 of the light-shielding region OB. The first sub-trench 140t may overlap at least a part of the first separation pattern 120F of the light-shielding region OB.

In one or more example embodiments, a pad trench 555t may be formed in the first substrate 110 of the pad region PR. The pad trench 555t may extend from the first side 110a of the first substrate 110 of the pad region PR. In one or more example embodiments, the pad trench 555t may be formed simultaneously with the first sub-trench 140t.

Figure 23:
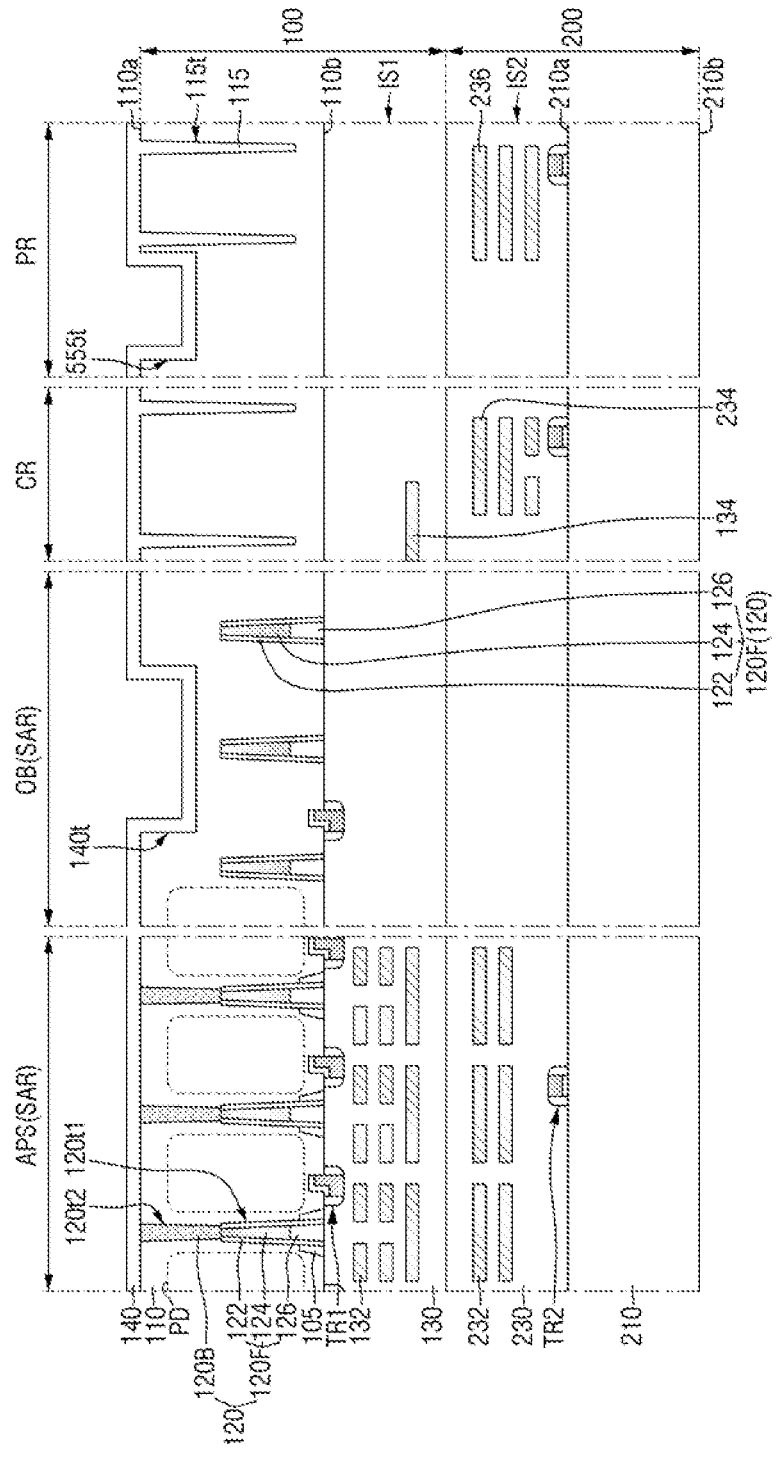

Referring to FIG. 23, a surface insulating film 140 is formed on the first side 110a of the first substrate 110.

The surface insulating film 140 may extend in a conformal manner along the first side 110a of the first substrate 110, the first sub-trench 140t and the pad trench 555t. The surface insulating film 140 may include, but is limited to, for example, at least one of silicon oxide, silicon nitride, silicon oxynitride, aluminum oxide, hafnium oxide, and combinations thereof. In one or more example embodiments, the surface insulating film 140 may include multiple films.

Figure 24:
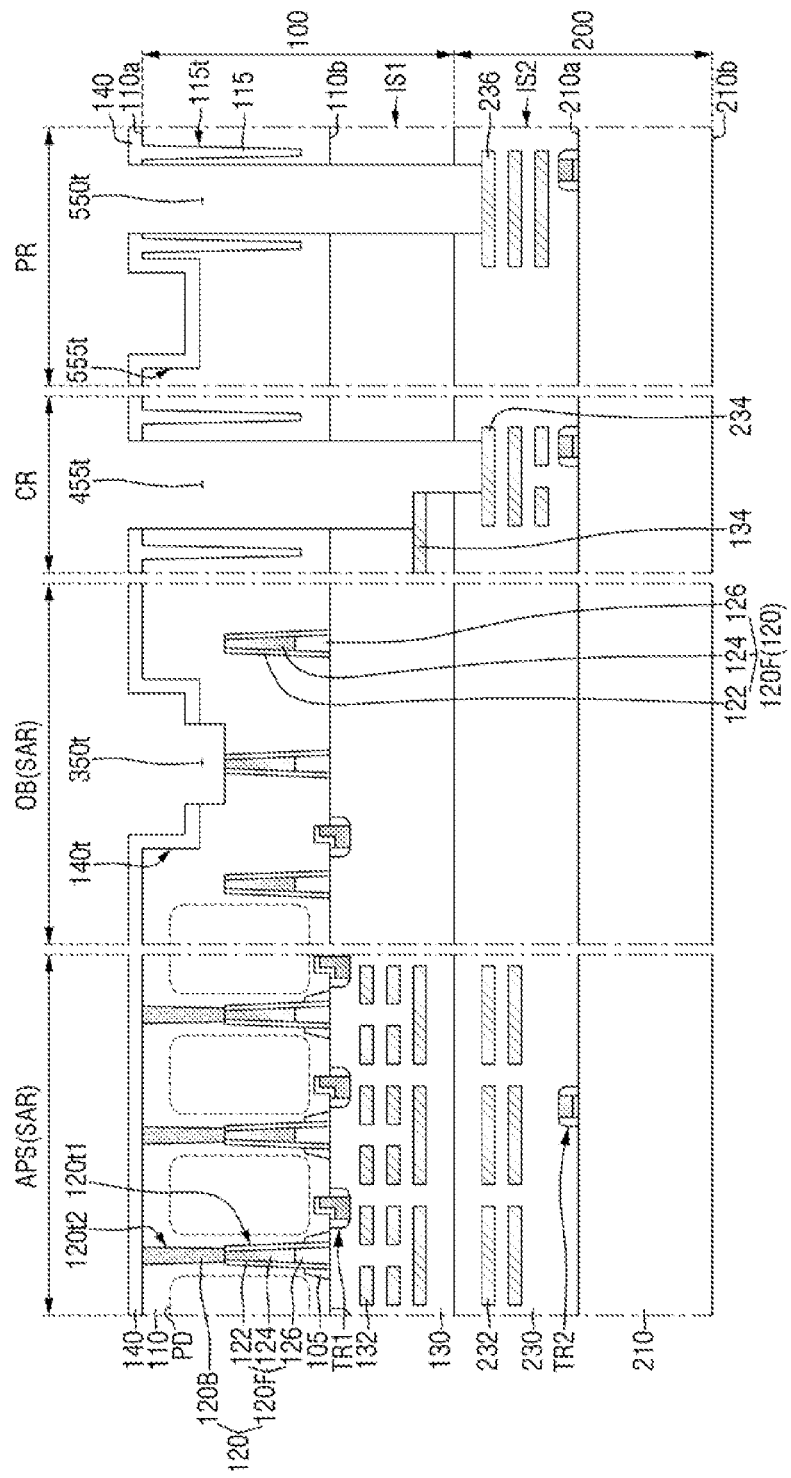

Referring to FIG. 24, a second sub-trench 350t is formed in the first substrate 110 of the light-shielding region OB.

The second sub-trench 350t may extend from the first side 110a of the first substrate 110 of the light-shielding region OB. The second separation trench 120t2 may be a deep trench formed by patterning the first substrate 110. The second sub-trench 350t may be formed in the first sub-trench 140t. The second sub-trench 350t may extend from the lower side of the first sub-trench 140t to expose the upper side of the first separation pattern 120F. Accordingly, contact trenches 140t and 350t including the first sub-trench 140t and the second sub-trench 350t may be formed.

In one or more example embodiments, a first connection trench 455t may be formed in the first substrate 110 of the connection region CR. The first connection trench 455t may extend from the first side 110a of the first substrate 110 to expose the second wiring 134 and the fourth wiring 234. The first connection trench 455t may be formed simultaneously with the second sub-trench 350t, or may be formed separately from the second sub-trench 350t.

In one or more example embodiments, a second connection trench 550t may be formed in the first substrate 110 of the pad region PR. The second connection trench 550t may extend from the first side 110a of the first substrate 110 to expose the fifth wiring 236. The second connection trench 550t may be formed simultaneously with the second sub-trench 350t, or may be formed separately from the second sub-trench 350t.

Figure 25:
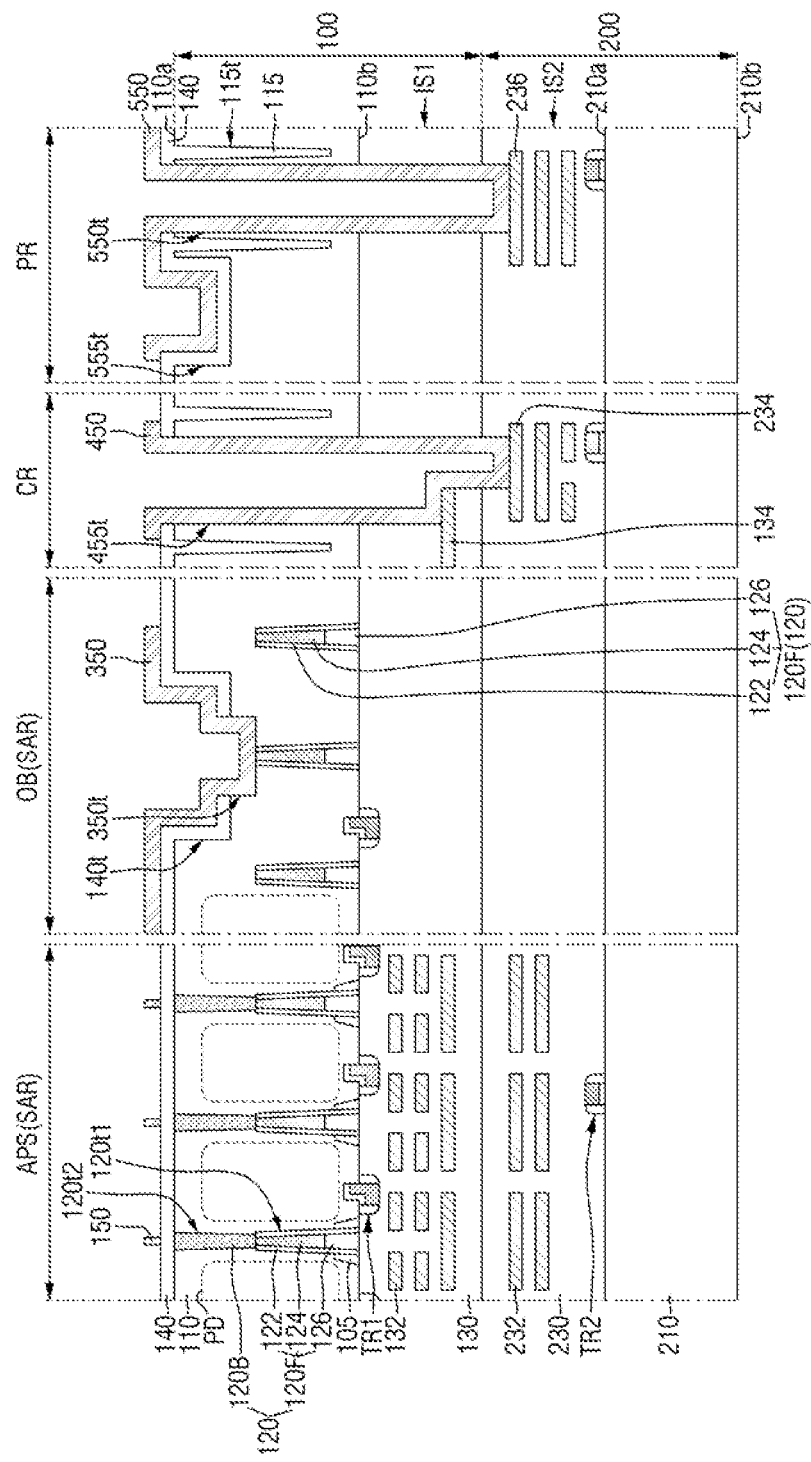

Referring to FIG. 25, a contact film 350 is formed in the contact trenches 140t and 350t.

The contact film 350 may fill at least a part of the contact trenches 140t and 350t. In one or more example embodiments, the contact film 350 may extend in a conformal manner along the profiles of the contact trenches 140t and 350t. In one or more example embodiments, the contact film 350 may include multiple films. In one or more example embodiments, the contact film 350 may come into contact with the filling film 124 of the first separation pattern 120F.

Although not specifically illustrated, the contact film 350 may fill at least a part of the first connection trench 455t of the connection region CR. The contact film 350 may come into contact with the filling film 124 of the first separation pattern 120F of the connection region CR.

Although not specifically illustrated, the contact film 350 may fill at least a part of the second connection trench 550t of pad region PR. The contact film 350 may come into contact with the filling film 124 of the first separation pattern 120F of pad region PR.

The contact film 350 may include a conductive substance. The contact film 350 may include, for example, but is not limited to, at least one of titanium (Ti), titanium nitride (TiN), tantalum (Ta), tantalum nitride (TaN), tungsten (W), aluminum (Al), copper (Cu), and combinations thereof.

In one or more example embodiments, a metal pattern 150 may be formed in the light-receiving region APS. The metal pattern 150 may be formed on the surface insulating film 140 of the light-receiving region APS. In one or more example embodiments, the metal pattern 150 may be placed to overlap the pixel separation pattern 120 of the light-receiving region APS in the vertical direction Z. The metal pattern 150 may be formed, but is not limited to, simultaneously with the contact film 350.

In one or more example embodiments, a first connection structure 450 may be formed in the connection region CR. In one or more example embodiments, the first connection structure 450 may extend in a conformal manner along the profiles of the sides and the lower side of the first connection trench 455t. The first connection structure 450 may be formed, but is not limited to, simultaneously with the contact film 350.

In one or more example embodiments, a second connection structure 550 may be formed in the pad region PR. In one or more example embodiments, the second connection structure 550 may extend in a conformal manner along the profiles of the sides and the lower side of the second connection trench 550t and the pad trench 555t. The second connection structure 550 may be formed, but is not limited to, simultaneously with the contact film 350.

Subsequently, referring to FIG. 15, the low-refractive index pattern 160, the first protective film 165, the first filling insulating film 460, the second filling insulating film 560, the color filter 170, the light-shielding filter 170C, the microlens 180, the flattening film 380 and the second protective film 185 are formed. Accordingly, the image sensor explained above using FIGS. 4 and 5 may be fabricated.

The method for fabricating the image sensor according to one or more example embodiments may implement the contact film 350 connected to the first separation pattern 120F in a simplified process. Specifically, as explained above, the first sub-trench 140t may be formed simultaneously with the pad trench 555t. Further, the first sub-trench 140t formed in the second sub-trench 350t may expose the first separation pattern 120F even at a shallow depth. Accordingly, it possible to provide a method for fabricating an image sensor which prevents defects due to a high aspect ratio by a simplified process and has improved performance.

Figure 26:
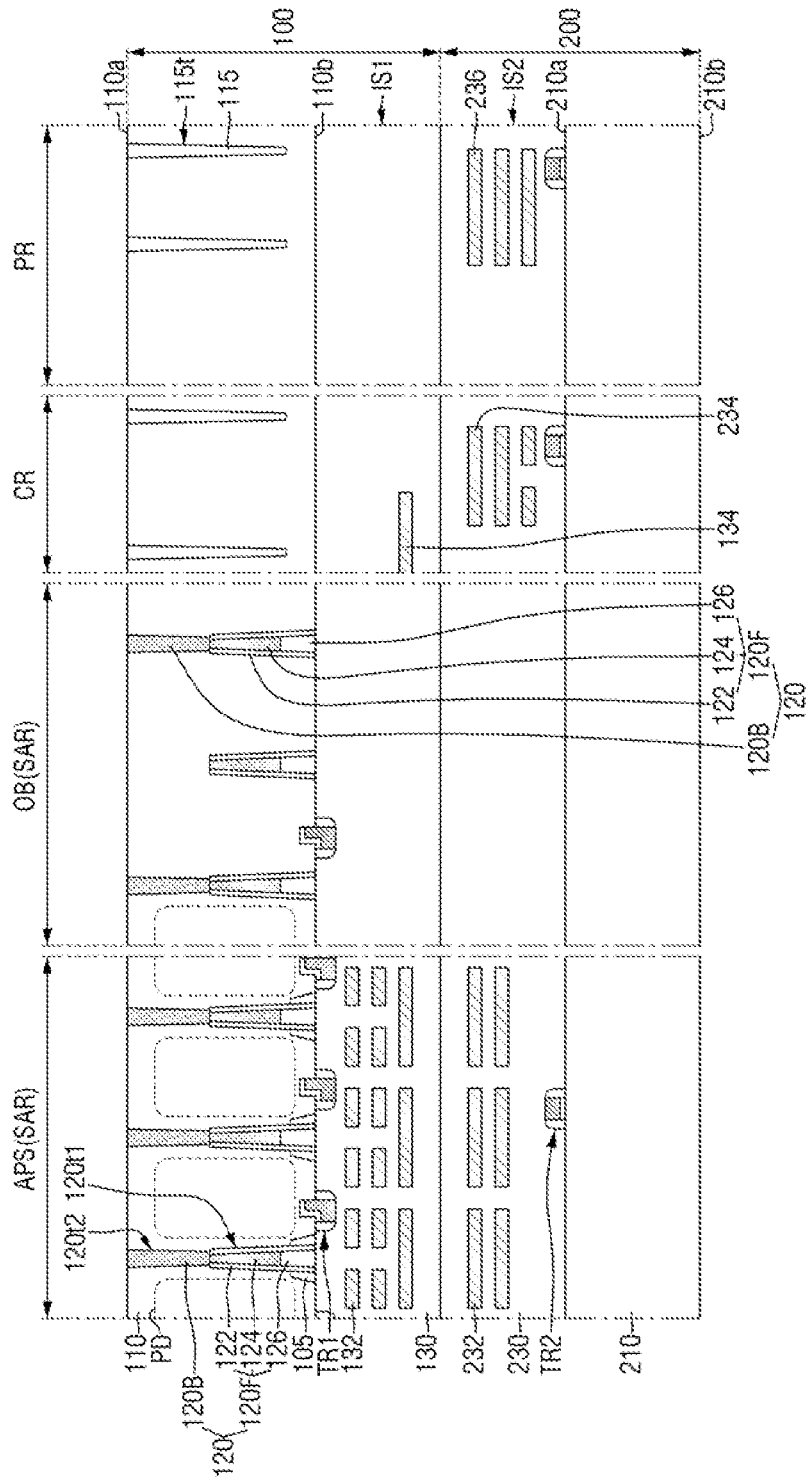
FIG. 26 is an intermediate stage diagram for explaining a method of fabricating an image sensor according to one or more example embodiments.

FIG. 26 is an intermediate stage diagram for explaining a method of fabricating an image sensor according to one or more example embodiments. For reference, FIG. 26 is a diagram for explaining the step after FIG. 20. For convenience of explanation, repeated parts of contents explained above using FIGS. 1 to 25 will be briefly explained or omitted.

Referring to FIG. 26, the first substrate structure 100 is attached onto the second substrate structure 200. Subsequently, a second separation pattern 120B extending from the first side 110a may be formed inside the first substrate 110.

In one or more example embodiments, the second separation pattern 120B may be placed in the light-receiving region APS and the light-shielding region OB. That is, the pixel separation pattern 120 of the light-shielding region OB may include the second separation pattern 120B. In one or more example embodiments, the second separation pattern 120B of the light-shielding region OB may not overlap the contact trenches 140t and 350t. For example, in the region of the first separation pattern 120F which overlaps the contact trenches 140t and 350t, the second separation pattern 120B may not be placed on the first separation pattern 120F.

Subsequently, the steps explained above FIGS. 22 to 25 may be performed. Accordingly, the image sensor explained above using FIGS. 8 and 9 may be fabricated.

Figure 27:
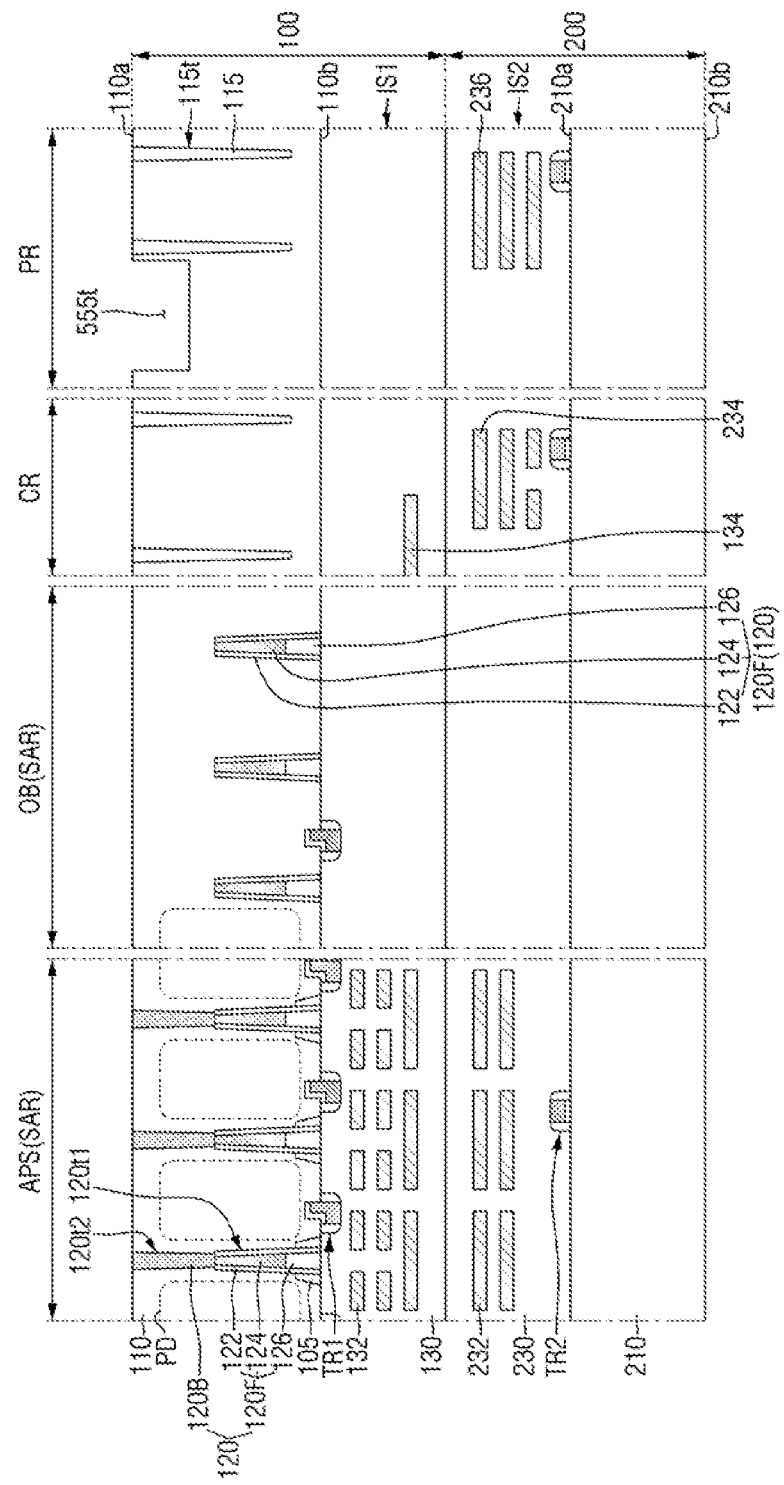
FIGS. 27 to 29 are intermediate stage diagrams for explaining the method for fabricating the image sensor according to one or more example embodiments.
Figure 28:
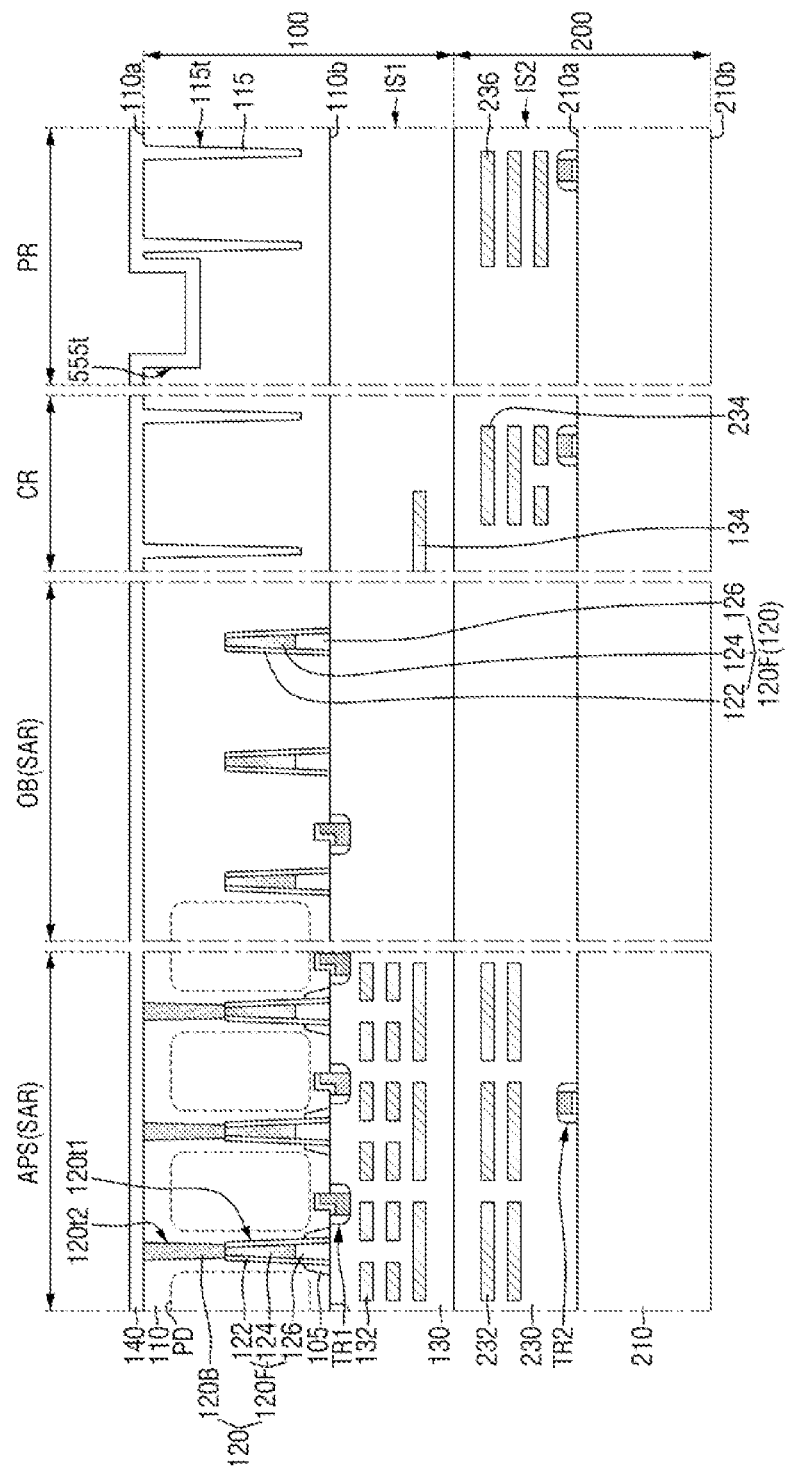
Figure 29:
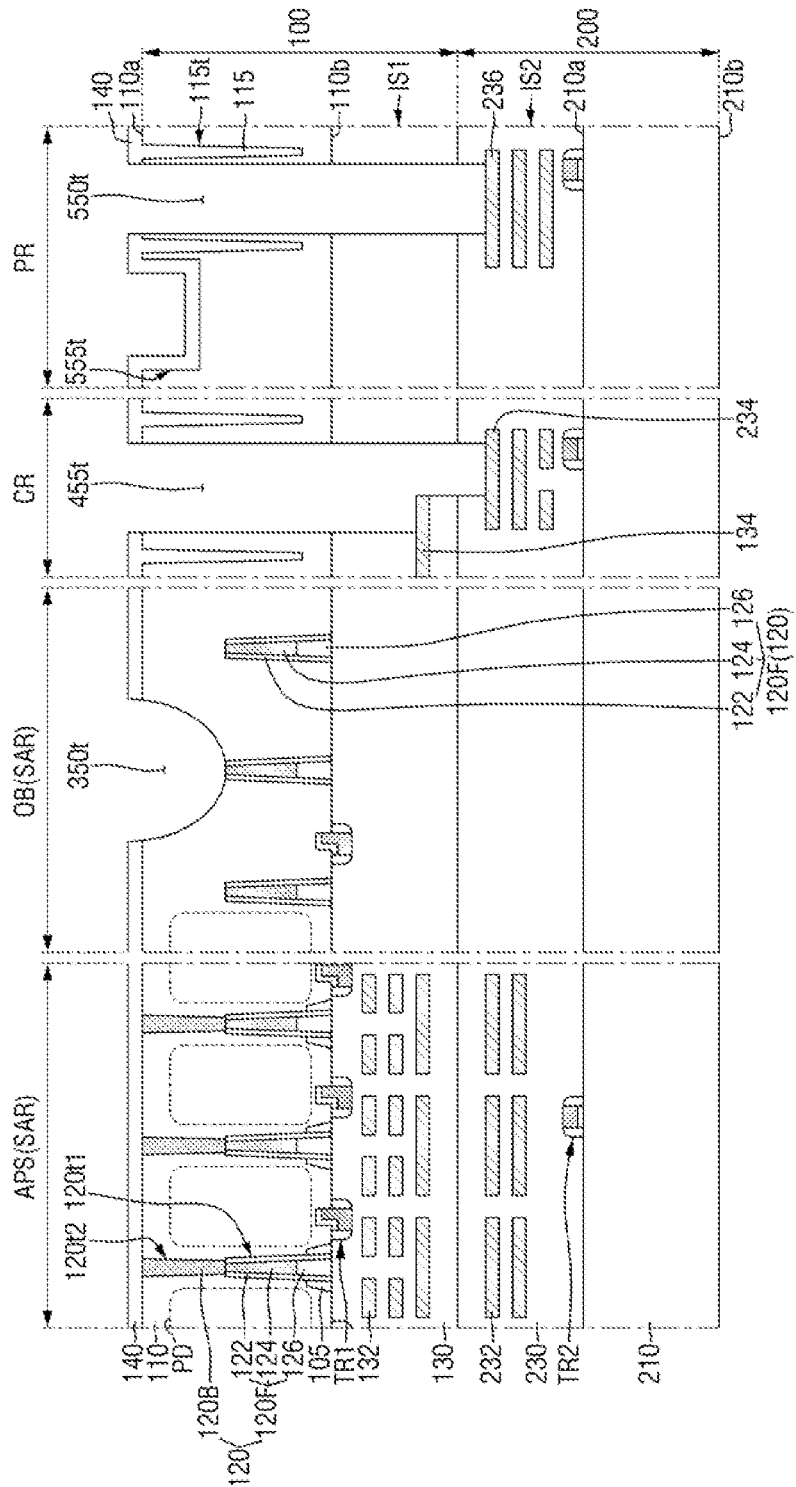

FIGS. 27 to 29 are intermediate stage diagrams for explaining the method for fabricating the image sensor according to one or more example embodiments. For reference, FIG. 27 is a diagram for explaining the step after FIG. 21. For convenience of explanation, repeated parts of contents explained above using FIGS. 1 to 25 will be briefly explained or omitted.

Referring to FIG. 27, a pad trench 555t is formed in the first substrate 110 of the pad region PR. Because formation of the pad trench 555t is similar to that explained above using FIG. 22, detailed explanation thereof will not be provided below.

In one or more example embodiments, the formation of the first sub-trench 140t in the first substrate 110 of the light-shielding region OB may be omitted.

Referring to FIG. 28, a surface insulating film 140 is formed on the first side 110a of the first substrate 110. Because the formation of the surface insulating film 140 is similar to that explained above using FIG. 23, detailed explanation thereof will not be provided below.

Referring to FIG. 29, a second sub-trench 350t is formed in the first substrate 110 of the light-shielding region OB. The second sub-trench 350t extends from the first side 110a of the first substrate 110, and may expose the first separation pattern 120F. The fourth depth (e.g., D22 of FIG. 11) of the second sub-trench 350t may be equal to or greater than the second depth (e.g., D12 of FIG. 11) of the second separation pattern 120B. In one or more example embodiments, the second sub-trench 350t may be formed at a relatively large width.

In one or more example embodiments, a first connection trench 455t may be formed in the first substrate 110 of the connection region CR. In one or more example embodiments, a second connection trench 550t may be formed in the first substrate 110 of the pad region PR. Because formation of the first connection trench 455t and the second connection trench 550t is similar to that explained above using FIG. 24, detailed explanation thereof will not be provided below.

Subsequently, the steps explained above using FIG. 26 may be performed. As a result, the image sensor explained above using FIGS. 10 and 11 may be fabricated.

Figure 30:
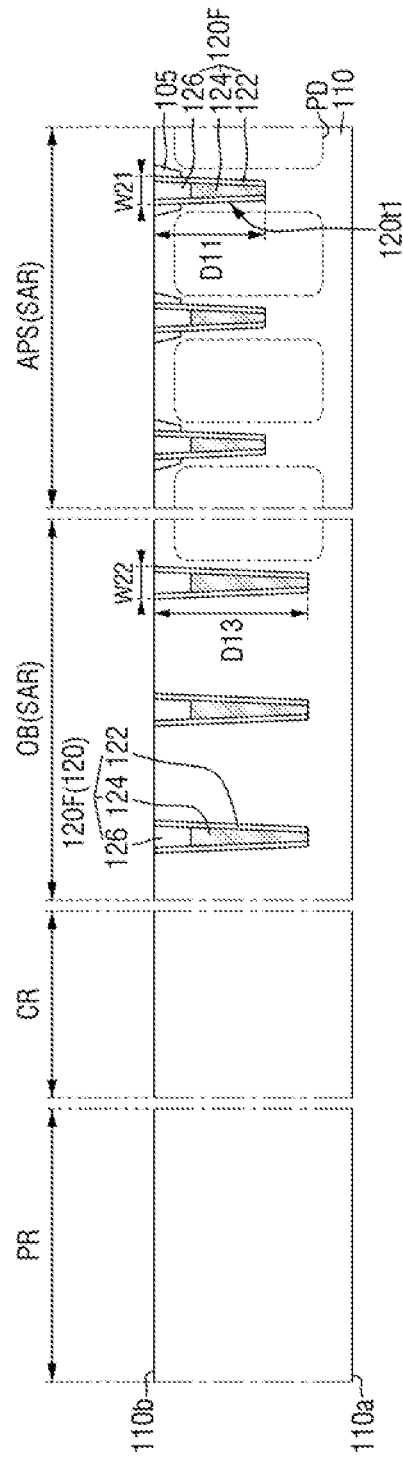
FIGS. 30 and 31 are intermediate stage diagrams for explaining the method for fabricating the image sensor according to one or more example embodiments.
Figure 31:
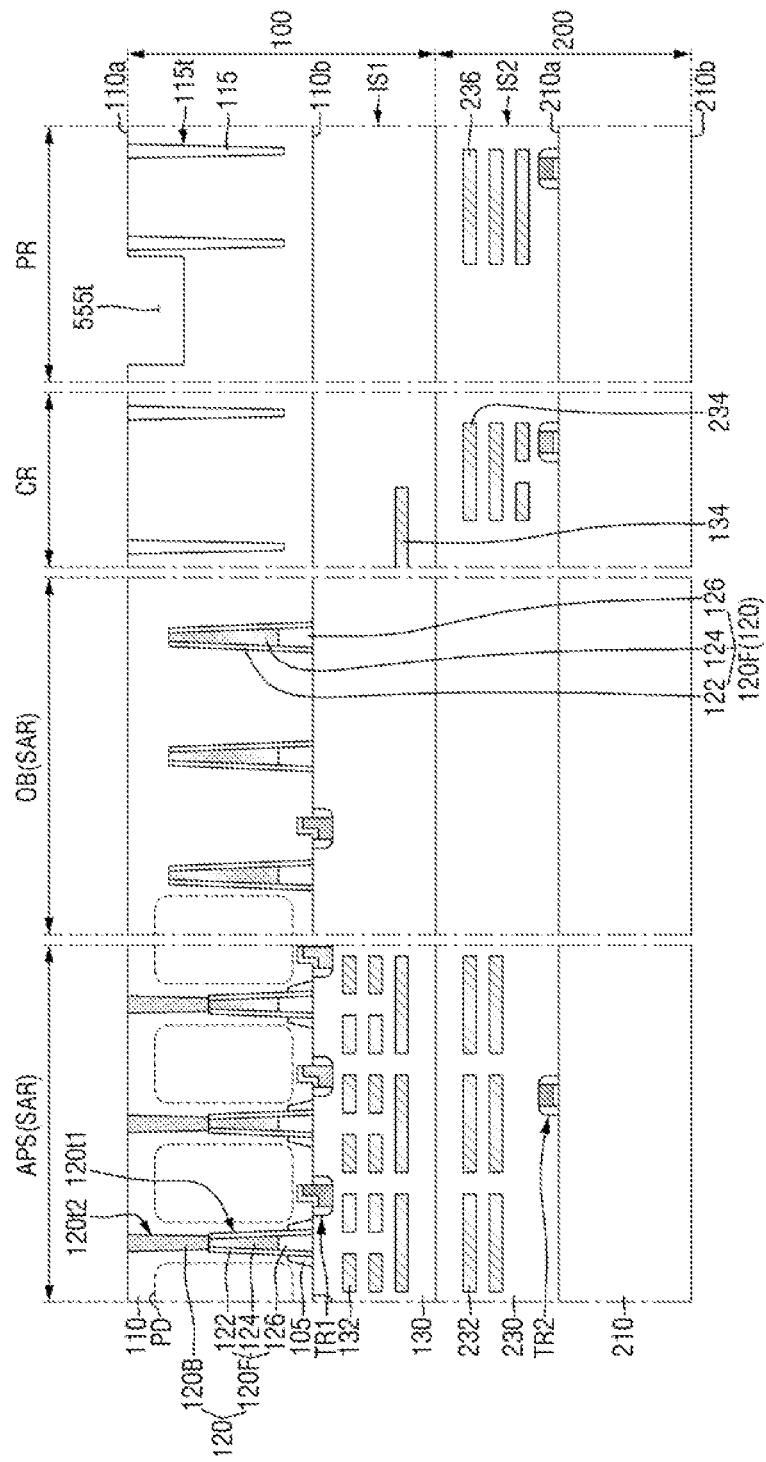

FIGS. 30 and 31 are intermediate stage diagrams for explaining the method for fabricating the image sensor according to one or more example embodiments. For reference, FIG. 30 is a diagram for explaining the step after FIG. 18. For convenience of explanation, repeated parts of contents explained above using FIGS. 1 to 25 will be briefly explained or omitted.

Referring to FIG. 30, a first insulating pattern 105 and a first separation pattern 120F are formed in the first substrate 110.

In one or more example embodiments, the first separation pattern 120F of the light-shielding region OB may be formed to be deeper than the first separation pattern 120F of the light-receiving region APS. For example, the first separation pattern 120F of the light-receiving region APS may be formed at the first depth D11 from the second side 110b of the first substrate 110. The first separation pattern 120F of the light-shielding region OB may be formed at the fifth depth D13 from the second side 110b of the first substrate 110. At this time, the fifth depth D13 may be greater than the first depth D11.

This may be due to the first separation pattern 120F of the light-shielding region OB being formed at the width greater than that of the first separation pattern 120F of the light-receiving region APS. For example, the first separation pattern 120F of the light-receiving region APS may be formed at the third width W21, and the first separation pattern 120F of the light-shielding region OB may be formed at the fourth width W22. At this time, the fourth width W22 may be greater than the third width W21.

Subsequently, the steps explained above using FIGS. 20 and 21 may be performed.

Subsequently, referring to FIG. 31, a pad trench 555t is formed in the first substrate 110 of the pad region PR. Because formation of the pad trench 555t is similar to that explained above using FIG. 22, detailed explanation thereof will not be provided below.

In one or more example embodiments, the formation of the first sub-trench 140t in the first substrate 110 of the light-shielding region OB may be omitted.

Subsequently, the steps explained above using FIGS. 28 and 29 may be performed. Subsequently, the steps explained above using FIG. 25 may be performed. Accordingly, the image sensor explained above using FIGS. 12 and 13 may be fabricated.

While example embodiments have been described, it will be understood that various changes in form and details may be made therein without departing from the spirit and scope of the disclosure as set forth in the following claims.

What is claimed is:

1. An image sensor comprising:
   a substrate comprising a first side on which light is incident and a second side opposite to the first side;
   a first separation pattern extending from the second side, the first separation pattern being interposed between a plurality of unit pixels in the substrate of a light-receiving region and a light-shielding region provided around the light-receiving region;

a second separation pattern extending from the first side and overlapping the first separation pattern, the second separation pattern being provided in the substrate of the light-receiving region; and
a contact film electrically connected to the first separation pattern, the contact film being provided in the substrate of the light-shielding region,
wherein a contact trench which extends from the first side is formed in the light-shielding region of the substrate and exposes the first separation pattern, and
the contact film fills at least a part of the contact trench.

2. The image sensor of claim 1, wherein a width of the first separation pattern decreases as distance from the second side of the substrate increases, and
a width of the second separation pattern decreases as distance from the first side of the substrate increases.

3. The image sensor of claim 1, wherein a first separation trench which extends from the second side is formed in the substrate of the light-receiving region and the light-shielding region,
the first separation pattern comprises a spacer film and a filling film,
the spacer film extends along sides of the first separation trench and comprises an insulating substance,
the filling film is provided on the spacer film, fills at least a part of the first separation trench and comprises a conductive substance, and
the contact film is electrically connected to the filling film.

4. The image sensor of claim 3, wherein a second separation trench which extends from the first side is formed in the substrate of the light-receiving region and exposes the first separation pattern, and
the second separation pattern fills the second separation trench and comprises an insulating substance.

5. The image sensor of claim 1, wherein a first portion of the contact trench extends from the first side, and a second portion of the contact trench extends from a lower side of the first portion of the contact trench and exposes the first separation pattern.

6. The image sensor of claim 5, further comprising a surface insulating film extending along the first side and the first portion,
wherein the contact film extends along the surface insulating film and the second portion.

7. The image sensor of claim 5, wherein the lower side of the first portion is separated from the first separation pattern.

8. The image sensor of claim 1, wherein, with respect to the second side, a first depth at which the first separation pattern of the light-shielding region is formed is greater than a second depth at which the first separation pattern of the light-receiving region is formed.

9. The image sensor of claim 8, wherein a first width of the first separation pattern of the light-shielding region is greater than a second width of the first separation pattern of the light-receiving region.

10. An image sensor comprising:
a substrate comprising a first side on which light is incident and a second side opposite to the first side; and
a first separation pattern extending from the second side, the first separation pattern being interposed between a plurality of unit pixels in the substrate of a light-receiving region and a light-shielding region provided around the light-receiving region,
wherein a first sub-trench which extends from the first side is formed in the substrate of the light-shielding region,
a surface insulating film extends along the first sub-trench,
a second sub-trench, which is formed in the substrate and extends from the first sub-trench, exposes the first separation pattern and the surface insulating film, and
a contact film is provided on the surface insulating film, and extends along the first sub-trench and the second sub-trench to contact the first separation pattern.

11. The image sensor of claim 10, wherein a width of the first separation pattern decreases as distances from the second side of the substrate increases.

12. The image sensor of claim 10, further comprising a contact pattern provided on the contact film which fills the first sub-trench and the second sub-trench.

13. The image sensor of claim 10, wherein a first separation trench which extends from the second side is formed in the substrate of the light-receiving region and the light-shielding region,
the first separation pattern comprises a spacer film and a filling film,
the spacer film extends along sides of the first separation trench and comprises an insulating substance,
the filling film is provided on the spacer film, fills at least a part of the first separation trench and comprises a conductive substance, and
the contact film is electrically connected to the filling film.

14. The image sensor of claim 13, wherein a ground voltage or a negative voltage is applied to the filling film via the contact film.

15. The image sensor of claim 13, wherein a second separation trench which extends from the first side is formed in the substrate of the light-receiving region and exposes the first separation pattern, and
a second separation pattern fills the second separation trench and comprises an insulating substance.

16. An image sensor comprising:
a first substrate comprising a first side on which light is incident and a second side opposite to the first side;
a first separation pattern extending from the second side, the first separation pattern being interposed between a plurality of unit pixels in the first substrate of a light-receiving region and a light-shielding region provided around the light-receiving region;
a second separation pattern extending from the first side and overlapping the first separation pattern, the second separation pattern being provided in the first substrate of the light-receiving region;
a plurality of microlenses respectively corresponding to the plurality of unit pixels, the plurality of microlenses being provided on the first side of the first substrate;
a first wiring structure comprising a first inter-wiring insulating film and a first wiring provided in the first inter-wiring insulating film, the first wiring structure being provided on the second side of the first substrate;
a contact film extending from the first side and electrically connected to the first separation pattern, the contact film being provided in the first substrate of the light-shielding region; and
a pad pattern exposed through the first side on the first substrate of a pad region provided around the light-receiving region.

17. The image sensor of claim 16, wherein a width of the first separation pattern decreases as distance from the second side of the first substrate increases, and
a width of the second separation pattern decreases as distance from the first side of the first substrate increases.

18. The image sensor of claim 16, further comprising:
a second substrate which comprises a third side facing the second side of the first substrate and a fourth side opposite to the third side; and
a second wiring structure provided on the third side of the second substrate, the second wiring structure comprising a second inter-wiring insulating film attached to the first inter-wiring insulating film and a second wiring in the second inter-wiring insulating film.

19. The image sensor of claim 18, further comprising a first connection structure provided in the pad region which penetrates the first substrate and the first wiring structure and electrically connects the pad pattern and the second wiring.

20. The image sensor of claim 19, further comprising:
a connection region provided around the light-receiving region; and
a second connection structure formed in the connection region which penetrates the first substrate and the first wiring structure and electrically connects the contact film and the second wiring.

* * * * *